United States Patent
Lee et al.

(10) Patent No.: US 10,680,011 B2
(45) Date of Patent: Jun. 9, 2020

(54) VERTICAL SEMICONDUCTOR DEVICES

(71) Applicant: SAMSUNG ELECTRONICS CO., LTD., Suwon-si, Gyeonggi-Do (KR)

(72) Inventors: Kyung-Hwan Lee, Hwaseong-si (KR); Chang-Seok Kang, Seongnam-si (KR); Yong-Seok Kim, Suwon-si (KR); Jun-Hee Lim, Seoul (KR); Kohji Kanamori, Seongnam-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/263,417

(22) Filed: Jan. 31, 2019

(65) Prior Publication Data

US 2019/0393239 A1  Dec. 26, 2019

(30) Foreign Application Priority Data

Jun. 22, 2018 (KR) .................. 10-2018-0071737

(51) Int. Cl.
*H01L 29/792* (2006.01)
*H01L 27/11582* (2017.01)
*H01L 27/11565* (2017.01)

(52) U.S. Cl.
CPC .. *H01L 27/11582* (2013.01); *H01L 27/11565* (2013.01)

(58) Field of Classification Search
CPC ............... H01L 27/11582; H01L 27/11565
USPC ....................................................... 257/324
See application file for complete search history.

(56) References Cited

U.S. PATENT DOCUMENTS

| | | | | |
|---|---|---|---|---|
| 7,910,979 B2* | 3/2011 | Matsuoka | .......... | G11C 16/0483 257/324 |
| 8,120,961 B2* | 2/2012 | Katsumata | ......... | G11C 16/0483 257/295 |
| 8,343,820 B2* | 1/2013 | Jung | ................ | H01L 27/11551 438/156 |
| 8,440,528 B2* | 5/2013 | Kito | .................. | H01L 27/11551 257/E21.422 |
| 8,482,051 B2* | 7/2013 | Lim | ..................... | H01L 27/105 257/315 |
| 8,492,797 B2* | 7/2013 | Hwang | ............ | H01L 27/11551 257/208 |

(Continued)

*Primary Examiner* — Vu A Vu
(74) *Attorney, Agent, or Firm* — F. Chau & Associates, LLC

(57) ABSTRACT

A vertical semiconductor device includes a conductive pattern structure, a memory layer, a pillar structure, and second and third insulation patterns. The conductive pattern structure includes conductive patterns and insulation layers, and may include a first portion extending in a first direction and a second portion protruding from a sidewall of the first portion. The conductive pattern structures are arranged in a second direction perpendicular to the first direction to form a trench therebetween. The memory layer is formed on sidewalls of the conductive pattern structures. The pillar structures in the trench, each including a channel pattern and a first insulation pattern formed on the memory layer, are spaced apart from each other in the first direction. The second insulation pattern is formed between the pillar structures. The third insulation pattern is formed between some pillar structures, and has a shape different from a shape of the second insulation pattern.

20 Claims, 29 Drawing Sheets

(56) References Cited

U.S. PATENT DOCUMENTS

| | | | |
|---|---|---|---|
| 8,643,084 B2* | 2/2014 | Shin | H01L 27/11578 |
| | | | 257/317 |
| 8,928,063 B2* | 1/2015 | Kim | H01L 29/792 |
| | | | 257/324 |
| 8,933,457 B2 | 1/2015 | Lai | |
| 9,000,509 B2* | 4/2015 | Lee | H01L 27/11582 |
| | | | 257/324 |
| 9,257,442 B2* | 2/2016 | Lee | H01L 27/11582 |
| 9,343,672 B2 | 5/2016 | Park et al. | |
| 9,356,033 B2 | 5/2016 | Son et al. | |
| 9,431,412 B1 | 8/2016 | Kato et al. | |
| 9,524,980 B2* | 12/2016 | Lue | H01L 27/11582 |
| 9,721,965 B2* | 8/2017 | Yun | H01L 27/1157 |
| 9,728,546 B2 | 8/2017 | Serov et al. | |
| 9,754,957 B2 | 9/2017 | Lee et al. | |
| 9,831,257 B2* | 11/2017 | Lue | H01L 27/11556 |

\* cited by examiner

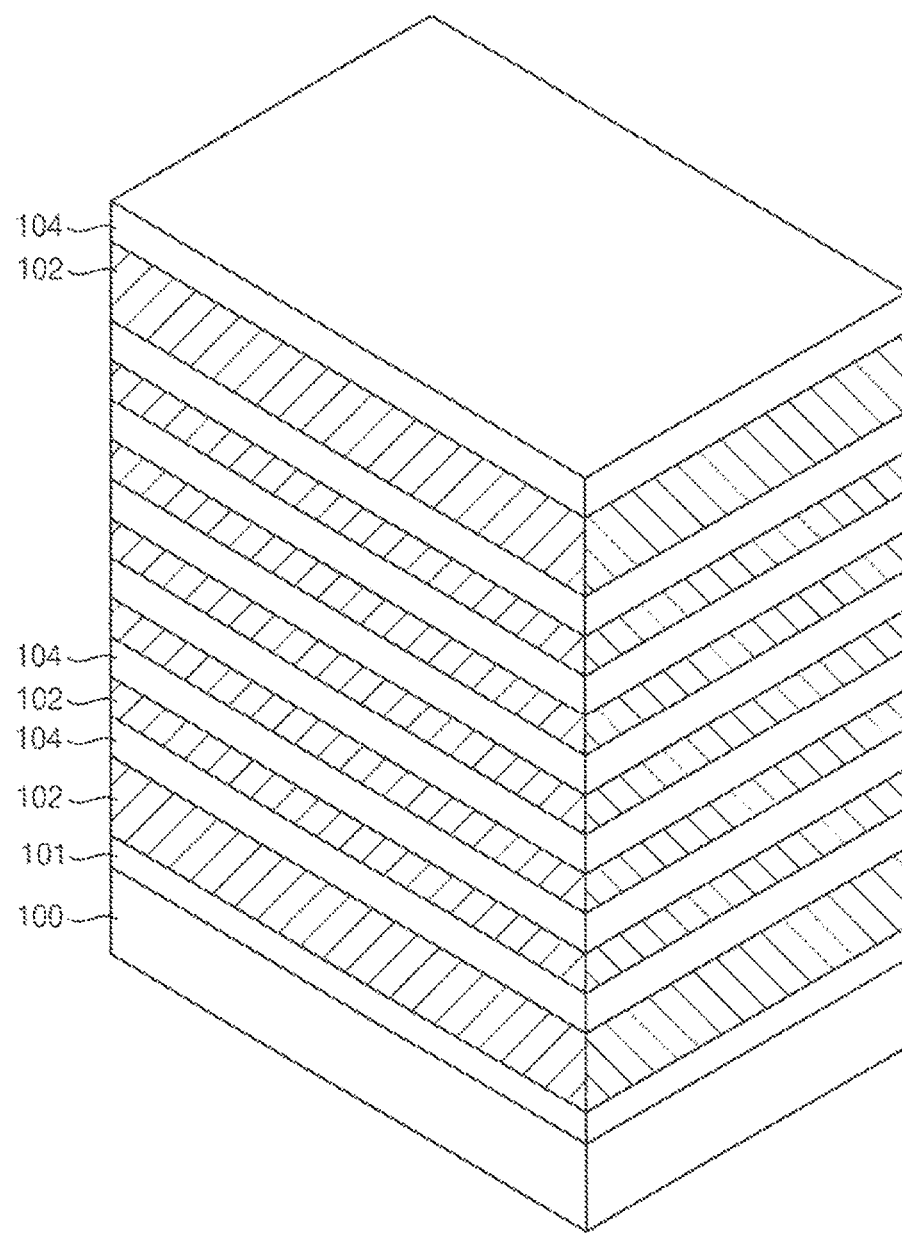

VERTICAL SEMICONDUCTOR DEVICES

CROSS-REFERENCE TO RELATED APPLICATION

This application claims priority under 35 U.S.C. § 119 to Korean Patent Application No. 10-2018-0071737, filed on Jun. 22, 2018, in the Korean Intellectual Property Office (KIPO), the contents of which are incorporated by reference herein in their entirety.

TECHNICAL FIELD

Example embodiments of the present inventive concept relate to vertical semiconductor devices, and more particularly, relate to vertical semiconductor devices having a stable structure.

DISCUSSION OF RELATED ART

In a vertical semiconductor device, a plurality of memory cells may be vertically stacked at a plurality of levels on a substrate. As the number of the levels increases, stacked structures in the vertical semiconductor device may lean due to high aspect ratio. Thus, the vertical semiconductor device may have an unstable structure.

SUMMARY

Example embodiments of the present inventive concept provide a vertical semiconductor device having a stable structure.

According to an example embodiment of the present inventive concept, there is provided a vertical semiconductor device that may include a conductive pattern structure, a memory layer, a pillar structure, a second insulation pattern and a third insulation pattern. The conductive pattern structure may include conductive patterns and insulation layers alternately and repeatedly stacked on a substrate. The conductive pattern structure may include a first portion extending in a first direction and a second portion protruding from a sidewall of the first portion. The conductive pattern structure may be provided in plural, and the plurality of conductive pattern structures may be arranged in a second direction perpendicular to the first direction to form a trench therebetween. The memory layer may be formed on sidewalls of the plurality of conductive pattern structures. The memory layer may include a blocking dielectric layer, a charge storage layer and a tunnel insulation layer. The pillar structure may be formed on the memory layer. The pillar structure may include a channel pattern and a first insulation pattern. The pillar structure may be provided in plural and the plurality of pillar structures in the trench may be spaced apart from each other in the first direction. The second insulation pattern may be formed between the plurality of pillar structures. The third insulation pattern may be formed between some of the plurality of pillar structures. The third insulation pattern may have a shape different from a shape of the second insulation pattern.

According to an example embodiment of the present inventive concept, there is provided a vertical semiconductor device that may include a conductive pattern structure, a memory layer, a pillar structure, a second insulation pattern and a third insulation. pattern. The conductive pattern structure may include conductive patterns and insulation layers alternately and repeatedly stacked on a substrate. The conductive pattern structure may include a first portion extending in a first direction and a second portion protruding in a second direction perpendicular to the first direction from a sidewall of the first portion. The conductive pattern structure mat be provided in plural, and a trench may be formed between the first portions and the second portions. The memory layer may be formed on a sidewall of the conductive pattern structure. The pillar structure including a channel pattern and a first insulation pattern may be formed on the memory layer. The pillar structure may be provided in plural and the plurality of pillar structures may be spaced apart from each other in the first direction. The second insulation pattern may be formed in the trench between the first portions. The second insulation pattern may be formed between the plurality of pillar structures. The third insulation pattern may be formed in the trench. The third insulation pattern may contact the second portion.

According to an example embodiment of the present inventive concept, there is provided a vertical semiconductor device that may include a plurality of conductive pattern structures, a memory layer, a pillar structure, a second insulation pattern and a third insulation pattern. Each of the plurality of conductive pattern structures may include conductive patterns and insulation layers alternately and repeatedly stacked on a substrate. Each of the plurality of conductive pattern structures may include a first portion extending in a first direction and a second portion protruding from a sidewall of the first portion. The memory layer may be formed on a sidewall of the plurality of conductive pattern structures. The memory layer may include a blocking dielectric layer, a charge storage layer and a tunnel insulation layer. The pillar structure may include a channel pattern and a first insulation pattern formed on the memory layer. The pillar structure may be provided in plural and the plurality of pillar structures may be spaced apart from each other in the first direction. The second insulation pattern may be formed in a trench between the plurality of conductive pattern structures. The second insulating pattern may be formed between the plurality of pillar structures. A longitudinal direction of the second insulation pattern may be a direction perpendicular to an extending direction of the trench. The third insulation pattern may be formed between some of the plurality of pillar structures. The third insulation pattern may have a shape different from a shape of the second insulation pattern.

In an example embodiment of the present inventive concept, a leaning of the stacked memory cells may decrease, so that the vertical semiconductor device may have a stable structure.

BRIEF DESCRIPTION OF THE DRAWINGS

Example embodiments of the present inventive concept will be more clearly understood from the following detailed description taken in conjunction with the accompanying drawings, in which:

FIGS. 8 to 21 are perspective views and plan views illustrating stages of a method of manufacturing a vertical semiconductor device in accordance with an example embodiment of the present inventive concept;

Figure 1:
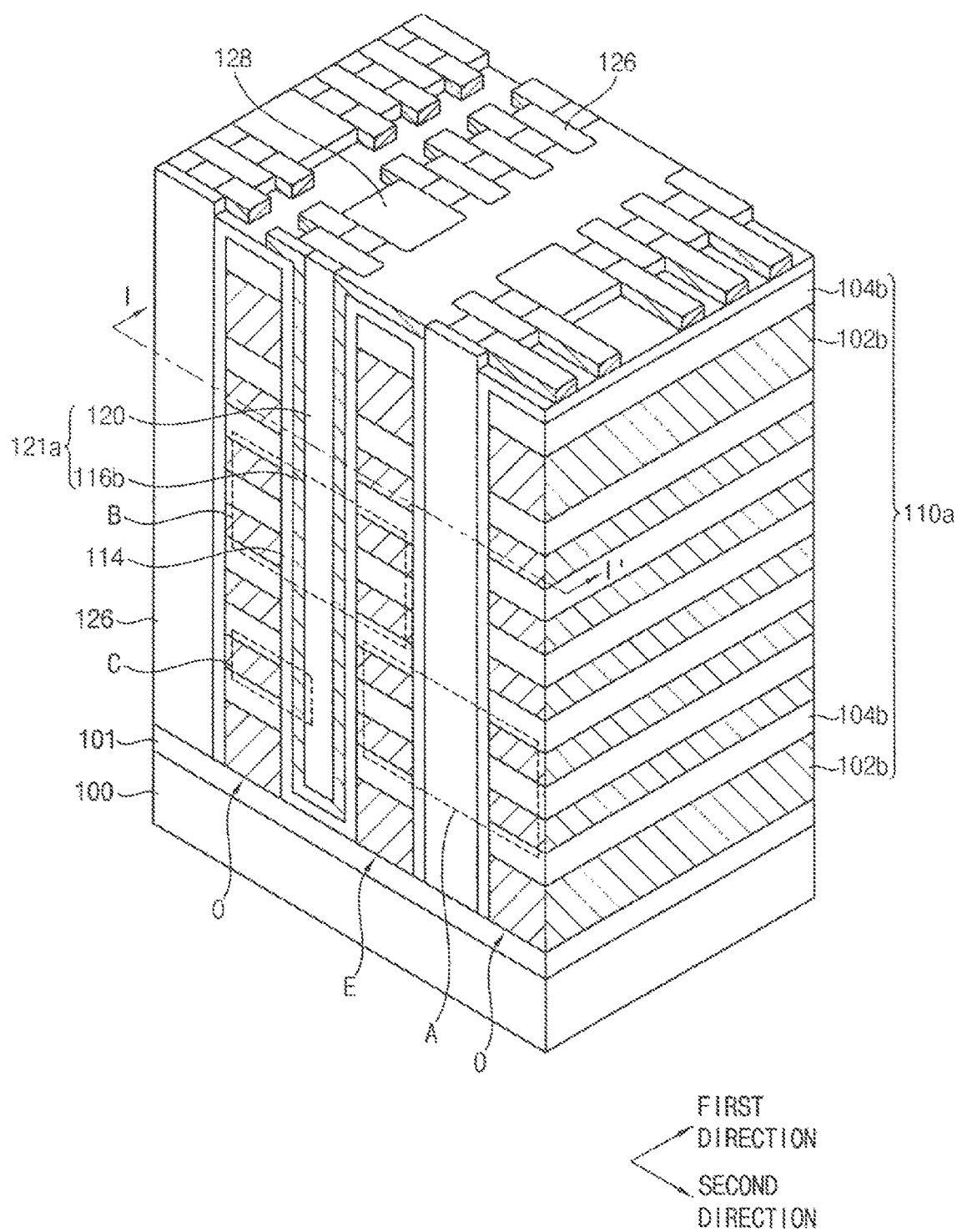
FIG. 1 is a perspective view illustrating a vertical semiconductor device in accordance with an example embodiment of the present inventive concept.

Since the drawings in FIGS. 1-29 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Example embodiments of the present inventive concept will be more clearly understood from the following detailed description taken in conjunction with the accompanying drawings. In the specification, a direction substantially parallel to the upper surface of the substrate may be defined as a first direction. A direction substantially parallel to the upper surface of the substrate and perpendicular to the first direction may be defined as a second direction. A direction substantially perpendicular to an upper surface of a substrate may be defined as a vertical direction. The vertical direction may be substantially perpendicular to the first and second directions.

Figure 6A:
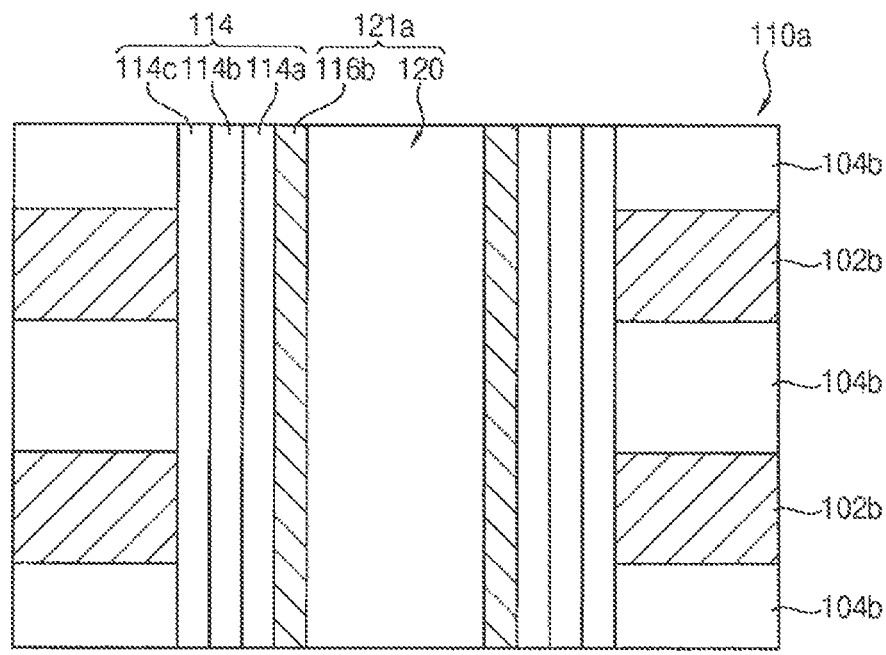
FIGS. 6A and 7A are cross-sectional views each illustrating a portion of a vertical semiconductor device in accordance with an example embodiment of the present inventive concept.
Figure 6B:
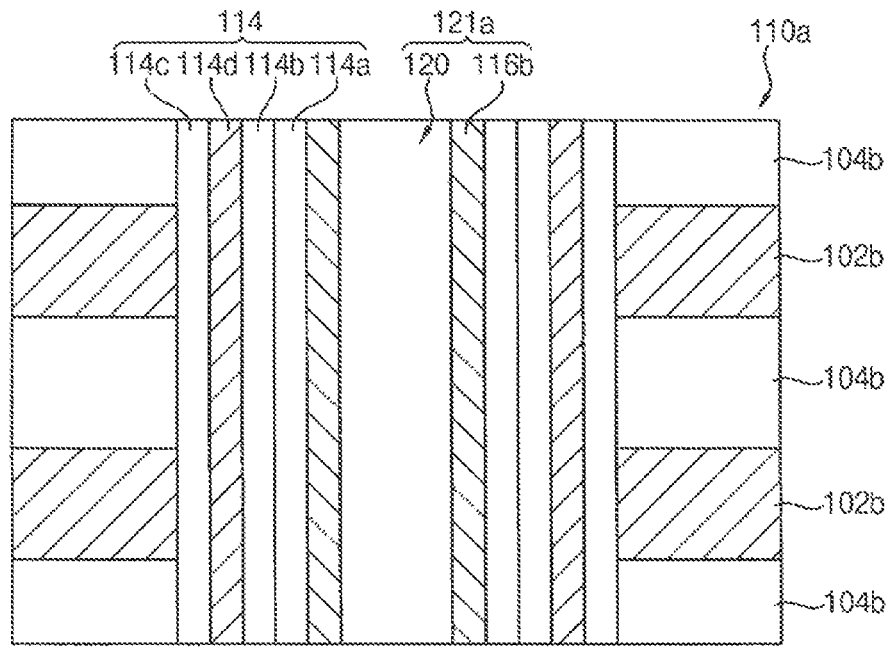
FIGS. 6B and 7B are cross-sectional views each illustrating a portion of a vertical semiconductor device in accordance with an example embodiment of the present inventive concept.
Figure 7A:
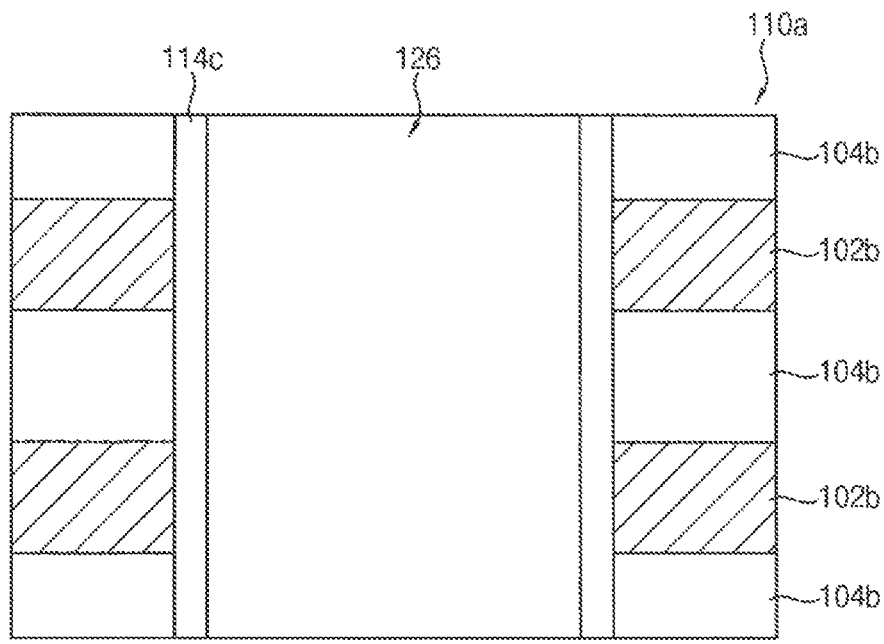
Figure 7B:
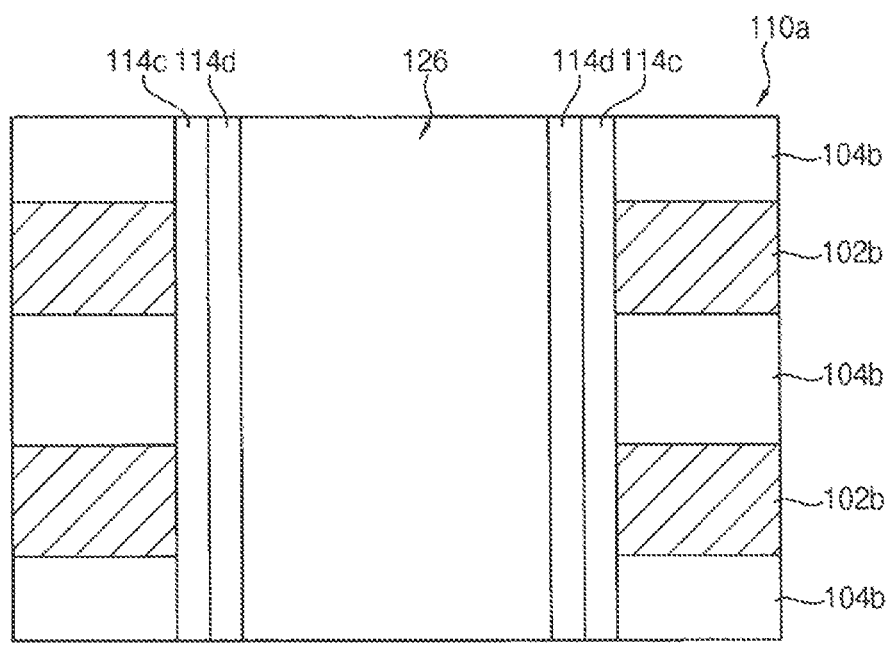

FIG. 1 is a perspective view illustrating a vertical semiconductor device in accordance with an example embodiment of the present inventive concept. FIGS. 2 to 5 are plan views each illustrating a portion of a vertical semiconductor device in accordance with an example embodiment of the present inventive concept. FIGS. 6A and 7A are cross-sectional views each illustrating a portion of a vertical semiconductor device in accordance with an example embodiment of the present inventive concept. FIGS. 6B and 7B are cross-sectional views each illustrating a portion of a vertical semiconductor device in accordance with an example embodiment of the present inventive concept. The cross-sectional views are taken in the vertical direction.

Each of FIGS. 2 to 5 is a plan view of a portion taken along line I-I' of FIG. 1. Each of FIGS. 6A and 6B is a "B" portion of FIG. 1. Each of FIGS. 7A and 7B is an "A" portion of FIG. 1.

Figure 2:
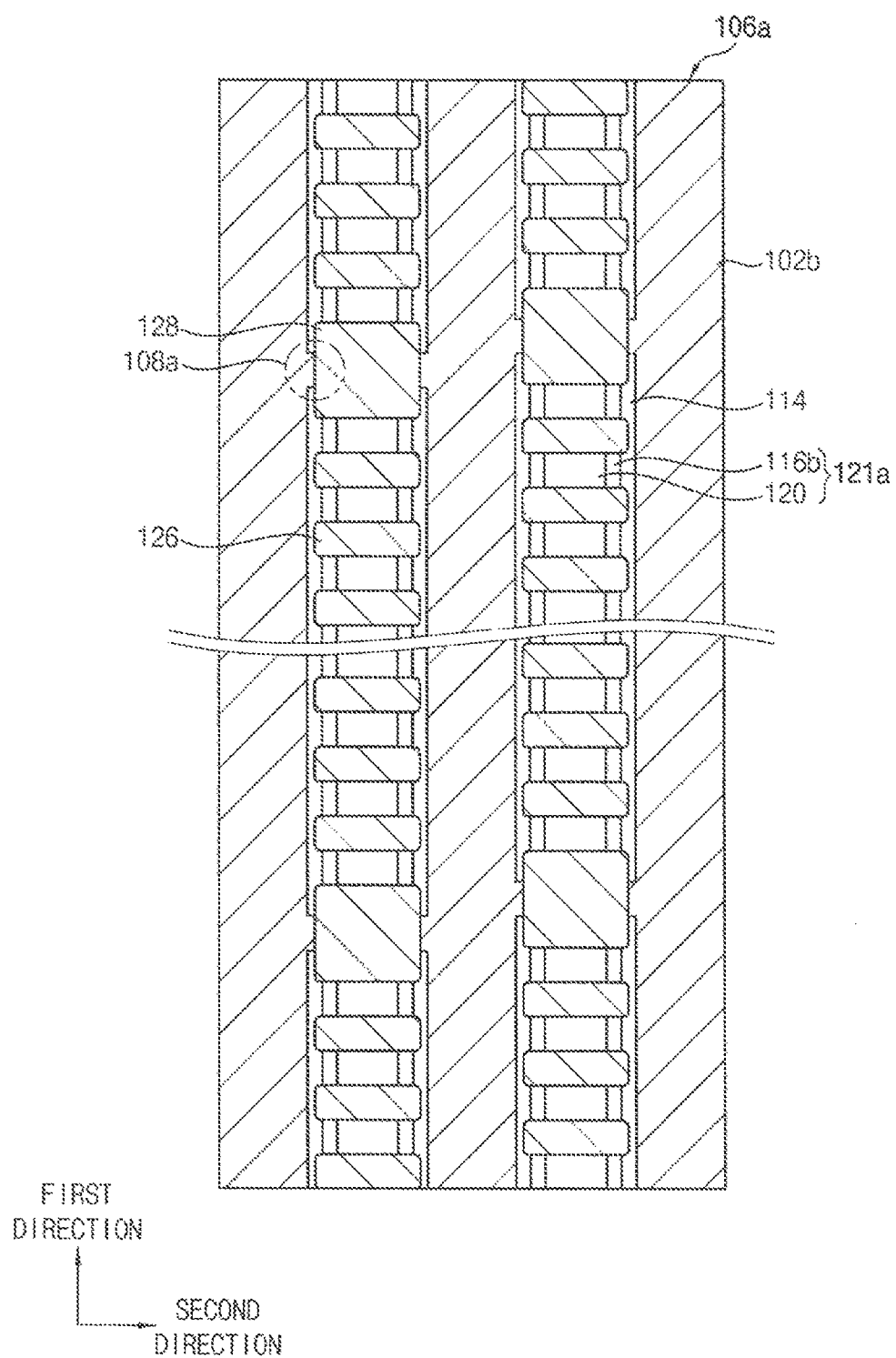
FIGS. 2 to 5 are plan views each illustrating a portion of a vertical semiconductor device in accordance with an example embodiment of the present inventive concept.

Referring to FIGS. 1 and 2, a lower insulation layer 101 may be formed on a substrate 100. A conductive pattern structure 110a may be formed on the lower insulation layer 101, and may include conductive patterns 102b and insulation patterns 104b alternatively and repeatedly stacked. In an example embodiment of the present inventive concept, the lower insulation layer 101 may be a kind of buffer layer, and may insulate the conductive pattern structure 110a from the substrate 100. The lower insulation layer 101 may include any suitable insulating material such as an oxide or a nitride.

The substrate 100 may include a semiconductor material, and may be, e.g., a silicon (Si) substrate, a germanium (Ge) substrate or a silicon-germanium (SiGe) substrate. However, the present inventive concept is not limited thereto. For example, in an example embodiment of the present inventive concept, the substrate 100 may include III-V compounds, e.g., gallium phosphide (GaP), gallium arsenide (GaAs), Gallium Antimonide (GaSb), etc. In an example embodiment of the present inventive concept, the substrate 100 may be a silicon-on-insulator (SOI) substrate or a germanium-on-insulator (GOI) substrate.

The conductive pattern structure 110a may extend in the first direction. A plurality of conductive pattern structures 110a may be arranged in the second direction. Thus, a trench may be formed between the conductive pattern structures 110a.

In an example embodiment of the present inventive concept, the conductive pattern structure 110a may include a first portion 106a extending in the first direction to have a line shape and a second portion 108a protruding from a sidewall of the first portion 106a. The trench 112 (refer to FIG. 9) may be formed between the first portions 106a and the second portions 108a of the conductive pattern structures 110a. Thus, the trench 112 (refer to FIG. 9) may extend in the first direction.

The second portions 108a of two neighboring ones of the conductive pattern structures 110a may be arranged to be aligned in the second direction. In an example embodiment of the present inventive concept, the second portions 108a of the two neighboring ones of the conductive pattern structures 110a may be opposite to each other. For example, the second portions 108a of the two neighboring ones of the conductive pattern structures 110a may be separated by a third insulation pattern 128 to be described.

Figure 3:
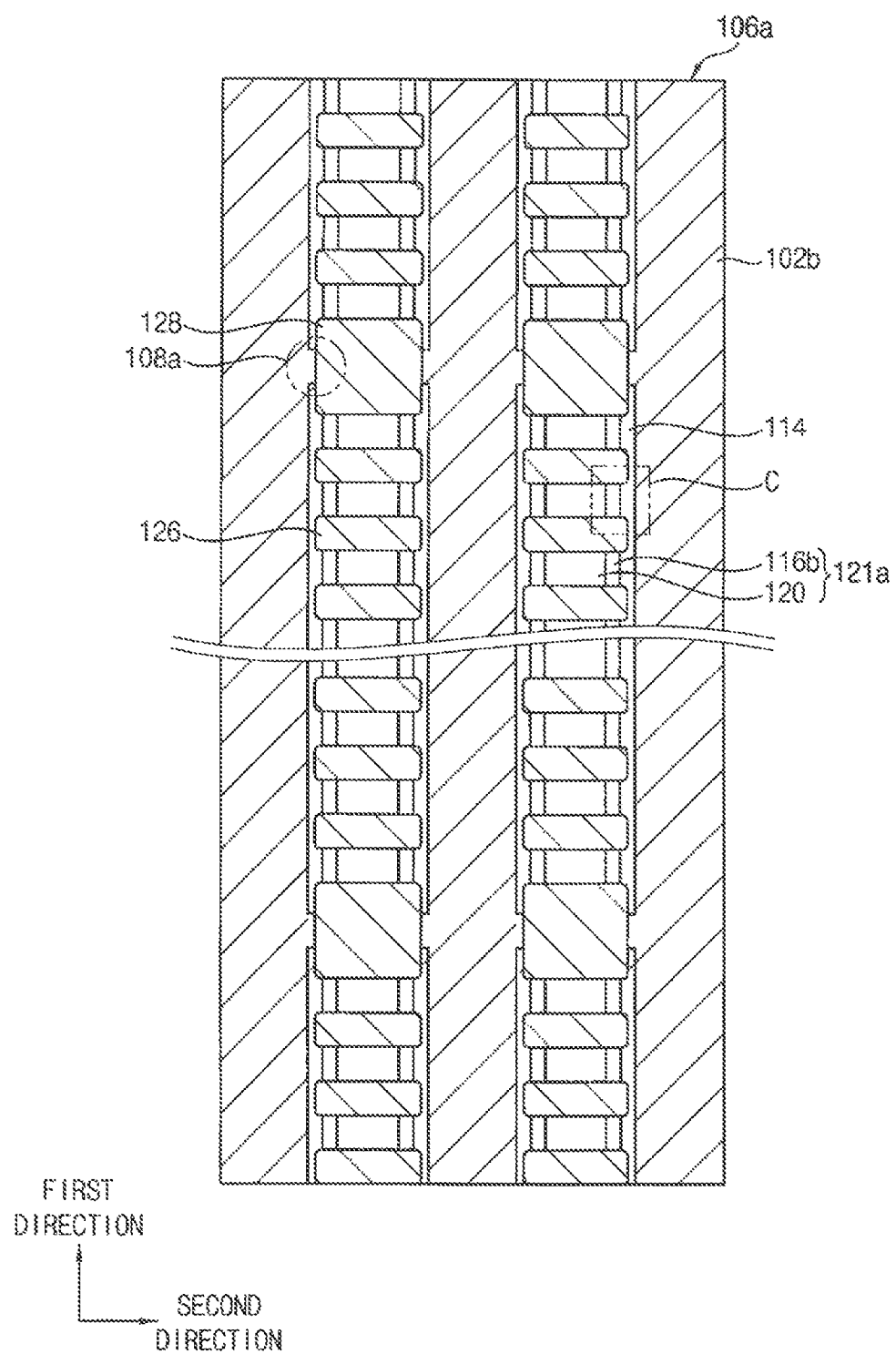
Figure 4:
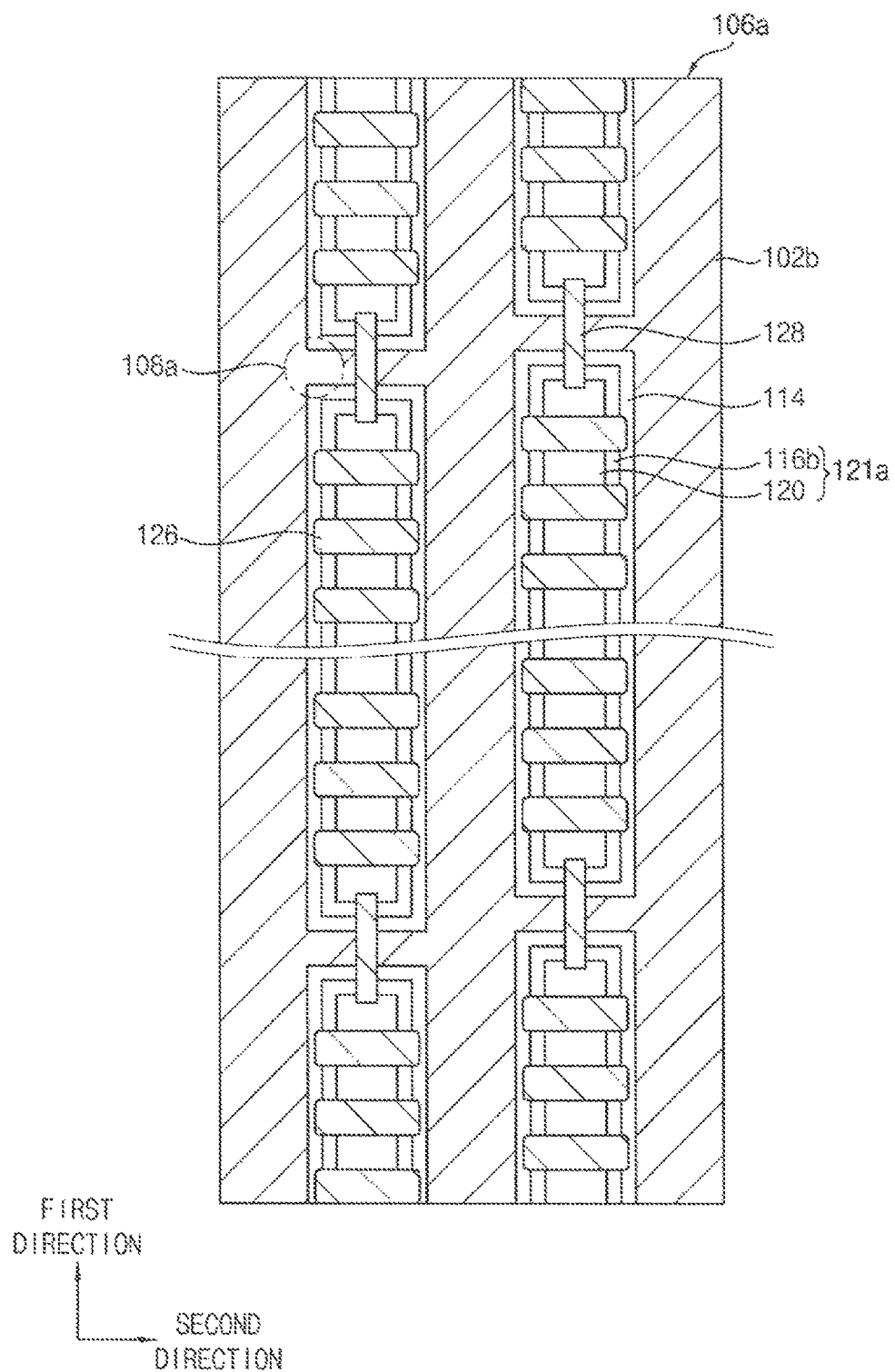
Figure 5:
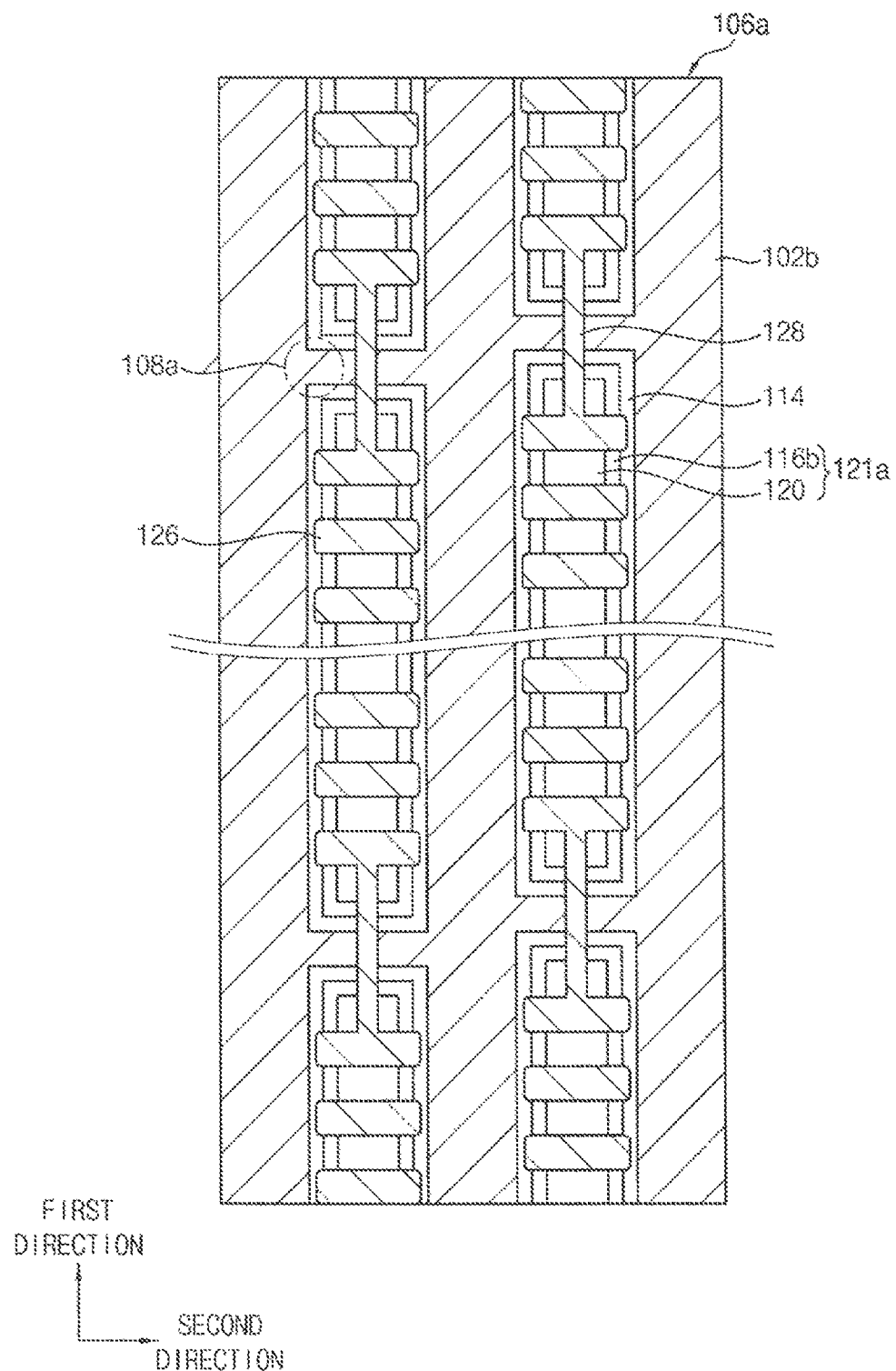

In an example embodiment of the present inventive concept, as shown in FIGS. 2, 4 and 5, the second portions 108a included in each of the conductive pattern structures 110a may not be aligned in the second direction. For example, the second portions 108a formed on opposite sidewalls of the first portion 106a may not be arranged to be aligned in the second direction. In an example embodiment of the present inventive concept, as shown in FIG. 3, the second portions 108a included in each of the conductive pattern structures 110a may be aligned in the second direction. For example, the second portions 108a formed on opposite sidewalk of the first portion 106a may be arranged to be aligned in the second direction.

In an example embodiment of the present inventive concept, the conductive patterns 102b may include, e.g., polysilicon. In an example embodiment of the present inventive concept, the conductive patterns 102b may include a metal which may be easily removed by a dry etching process. For example, the conductive patterns 102b may include, e.g., titanium (Ti), titanium nitride MN), tantalum (Ta), tantalum nitride (TaN), etc.

In an example embodiment of the present inventive concept, the insulation pattern 104b may include oxide, e.g., silicon oxide (SiO$_2$), silicon oxycarbide (SiOC), borosilicate glass (SiOB), etc. In an example embodiment of the present inventive concept, the lower insulation layer 101 and the insulation pattern 104b may include the same material.

The conductive pattern structures 110a may include an even conductive pattern structure E and an odd conductive pattern structure a In an example embodiment of the present inventive concept, an uppermost conductive pattern 102b of the odd conductive pattern structure O may serve as a gate electrode of a string selection transistor (SST). An uppermost conductive pattern 102b of the even conductive pattern structure E may serve as a gate electrode of a ground selection transistor (GST). In some cases, each of the ground selection transistor GST and the string selection transistor SST may be two or more. The conductive patterns 102b under the upper most conductive patterns of the even and odd conductive pattern structures E and O may serve as gate electrodes of cell transistors. That is, the gate electrodes of the cell transistors may serve as word lines. The word lines may extend in the first direction. The conductive patterns 102b as gate electrodes for the ground selection transistor GST and the string selection transistor SST may be thicker than the conductive patterns 102b as gate electrodes for the cell transistors, but the present inventive concept is not limited thereto. In an example embodiment of the present inventive concept, lowermost conductive patterns of the even and odd conductive pattern structures E and O may serve as gate electrodes of an assist transistor.

A memory layer 114 may be conformally formed on a surface of the conductive pattern structures 110a and the lower insulation layer 101 between the conductive pattern structures 110a. Although the memory layer 114 is shown as a single layer for convenience, the memory layer 114 may include a plurality of layers stacked.

In an example embodiment of the present inventive concept, as shown in FIG. 6A, the memory layer 114 may include a blocking dielectric layer 114c, a charge storage layer 114b and a tunnel insulation layer 114a sequentially stacked on the surface of the conductive pattern structures 110a, and thus also stacked on the lower insulation layer 101 between the conductive pattern structures 110a. For example, the memory layer 114 may include a silicon oxide (SiO$_2$)) layer, a silicon nitride (Si$_3$N$_4$) layer and a silicon oxide (SiO$_2$) layer sequentially stacked on the surface of the conductive pattern structures 110a and the lower insulation layer 101 between the conductive pattern structures 110a.

In an example embodiment of the present inventive concept, as shown in FIG. 613, the memory layer 114 may include a blocking dielectric layer 114c, an etch stop layer 114d, a charge storage layer 114b and a tunnel insulation layer 114a sequentially stacked on the surface of the conductive pattern structures 110a, and thus also stacked on the lower insulation layer 101 between the conductive pattern structures 110a. For example, the memory layer 114 may include a silicon oxide (SiO$_2$) layer, a metal oxide layer, a silicon nitride (Si$_3$N$_4$) layer and a silicon oxide (SiO$_2$) layer sequentially stacked on the surface of the conductive pattern structures 110a and the lower insulation layer 101 between the conductive pattern structures 110a. The metal oxide layer may serve as the etch stop layer 114d, and may include, e.g., aluminum oxide (Al$_2$O$_3$).

A channel pattern 116b may be formed on the memory layer 114. For example, the channel pattern 116b may be formed on the surface of the tunnel insulation layer 114a included in the memory layer 114. The channel pattern 116b may be formed on at least sidewalls of the even and odd conductive pattern structures E and O and the lower insulation layer 101 between the even and odd conductive pattern structures E and O. A portion of the channel pattern 116b may be formed over an upper surface of the conductive pattern structures 110a. The channel pattern 116b may include, e.g., polysilicon.

In a cross-sectional view, the channel pattern 116b may have a "U" shape in the trench. In the trench, a plurality of channel patterns 116b may be spaced apart from each other in the first direction. For example, in the trench, two neighboring ones of the plurality of channel patterns 116b in the first direction may be separated by a second insulation pattern 126 to be described.

A first insulation pattern 120 may be formed on the channel patterns 116b in the trench. For example, the first insulation pattern 120 may be formed on sidewalls of the channel patterns 116b and may be interposed between two sidewalls of the channel patterns 116b. The channel pattern 116b and the first insulation pattern 120 may have a pillar shape in the trench, and may serve as a pillar structure 121a. The pillar structure 121a may fill a portion of the trench.

A plurality of pillar structures 121a may be spaced apart from each other in the first direction. The pillar structures 121a arranged in the first direction may be referred to as a first group pillar structure. In an example embodiment of the present inventive concept, the first group pillar structure may be formed in the trench between the second portions 108a of the conductive pattern structures 110a. A second insulation pattern 126 may be formed between the pillar structures 121a in the first group pillar structure. For example, two neighboring ones of the plurality of pillar structures 121a may be separated by the second insulation pattern 126 in the first direction.

In an example embodiment of the present inventive concept, sidewalk in the second direction of the second insulation pattern 126 may contact one layer included in the memory layer 114.

As shown in FIG. 7A, the sidewalls in the second direction of the second insulation pattern 126 may contact the blocking dielectric layer 114c. In this case, the blocking dielectric layer 114c may be continuously formed on a sidewall of the conductive pattern structure 110a. A stack structure including the charge storage layer 114b and the tunnel insulation layer 114a may be formed on the blocking dielectric layer 114c, and a plurality of the stack structures may be spaced apart from each other in the first direction. For example, two neighboring ones of the plurality of stack structures may be separated by the second insulation pattern 126 in the first direction.

In an example embodiment of the present inventive concept, the sidewalls in the second direction of the second insulation pattern 126 may contact the tunnel insulation layer 114a or the charge storage layer 114b. In the case that the sidewalls in the second direction of the second insulation pattern 126 contact the tunnel insulation layer 114a, the stack structure including the blocking dielectric layer 114c, the charge storage layer 114b and the tunnel insulation layer 114a may be continuously formed on a sidewall of the conductive pattern structure 110a, and may not be separated by the second insulation pattern 126 in the first direction.

In an example embodiment of the present inventive concept, as shown in FIG. 7B, the sidewalk in the second direction of the second insulation pattern 126 may contact the etch stop layer 114d. In this case, the blocking dielectric layer 114c and the etch stop layer 114d may be continuously formed on a sidewall of the conductive pattern structure 110a. A stack structure including the charge storage layer 114b and the tunnel insulation layer 114a may be formed on the etch stop layer 114d, and a plurality of the stack structure may be spaced apart from each other in the first direction. For example, two neighboring ones of the plurality of stack structures may be separated by the second insulation pattern 126 in the first direction.

A plurality of first group pillar structures may be spaced apart from each other in the first direction. A third insulation pattern 128 may be formed between two neighboring ones of the plurality of first group pillar structures in the first direction. That is, the first group pillar structures may be separated from each other by the third insulation pattern 128. Sidewalk in the second direction of the third insulation pattern 128 may contact the second portions 108a of the conductive pattern structures 110a. For example, the second portions 108a of two neighboring ones of the conductive pattern structures 110a may be separated by the third insulation pattern 128, and may be aligned in the second direction. The third insulation pattern 128 may have a shape different from a shape of the second insulation pattern 126.

In an example embodiment of the present inventive concept, all or some of the channel patterns 116b in the trench may have substantially the same width in the first direction or in the second direction. All or some of gaps in the first direction or in the second direction between the channel patterns 116b in the trench may be substantially the same.

In an example embodiment of the present inventive concept, the vertical semiconductor device may have one plan view of those shown in FIGS. 2 to 5.

In an example embodiment of the present inventive concept, as shown in FIGS. 2 and 3, a width in the first direction of the third insulation pattern 128 may be greater than a width in the first direction of the second insulation pattern 126. A distance between two neighboring ones of the first group pillar structures may be greater than a distance between two neighboring ones of the pillar structures 121a in each of the first group pillar structures. The width in the first direction of the third insulation pattern 128 may be greater than sum of the width in the first direction of the second portion 108a of the conductive pattern structure 110a and a deposition thickness of the memory layer 114 and the channel pattern 116b. For example, the sidewall in the first direction of the third insulation pattern 128 may contact the first insulation pattern 120.

A width in the second direction of the third insulation pattern 128 may be substantially the same as a width in the second direction of the second insulation pattern 126. The third insulation pattern 128 and the second insulation pattern 126 neighboring the third insulation pattern 128 may be spaced apart from each other.

In an example embodiment of the present inventive concept, as shown in FIG. 4, a width in the first direction of the third insulation pattern 128 may be greater than a width in the first direction of the second insulation pattern 126. The width in the first direction of the third insulation pattern 128 may be greater than sum of the width in the first direction of the second portion 108a of the conductive pattern structure 110a and a deposition thickness of the memory layer 114 and the channel pattern 116b. For example, the sidewall in the first direction of the third insulation pattern 128 may contact the first insulation pattern 120.

A width in the second direction of the third insulation pattern 128 may be smaller than a width in the second direction of the second insulation pattern 126. The third insulation pattern 128 and the second insulation pattern 126 neighboring the third insulation pattern 128 may be spaced apart from each other. The channel pattern 116b and the memory layer 114 may contact the sidewall in the second direction of the third insulation pattern 128. In a plan view, the channel pattern 116b and the memory layer 114 may bend in the second direction to contact the sidewall of the third insulation pattern 128.

In an example embodiment of the present inventive concept, as shown in FIG. 5, a width in the first direction of the third insulation pattern 128 may be greater than a width in the first direction of the second insulation pattern 126. The width in the first direction of the third insulation pattern 128 may be greater than sum of the width in the first direction of the second portion 108a of the conductive pattern structure 110a and a deposition thickness of the memory layer 114 and the channel pattern 116b.

A width in the second direction of the third insulation pattern 128 may be smaller than a width in the second direction of the second insulation pattern 126. The third insulation pattern 128 and the second insulation pattern 126 neighboring the third insulation pattern 128 in the first direction may contact each other. In a plan view, the third insulation pattern 128 and two of the second insulation patterns 126 adjacent to the third insulation pattern 128 may have an "I" shape. The channel pattern 116b and the memory layer 114 may contact the sidewall in the second direction of the third insulation pattern 128. In a plan view, the channel pattern 116b and the memory layer 114 may bend in the second direction to contact the sidewall of the third insulation pattern 128.

In an example embodiment of the present inventive concept, the channel pattern 116b on the even conductive pattern structure E may have a shape different from a shape of the channel pattern 116b on the odd conductive pattern structure O.

The channel patterns 116b on the odd conductive pattern structure O may be spaced apart from each other in the first direction. The channel pattern 116b on the even conductive pattern structure E may extend in the first direction. For example, the channel pattern 116b on the upper surface of the even conductive pattern structure E may not be etched, and may extend in the first direction on the upper surface of the even conductive pattern structure E. In this case, the channel patterns 116b on the odd conductive pattern structure O may be electrically connected to the SST, and the channel pattern 116b on the even conductive pattern structure E may be electrically connected to the GST.

The channel pattern 116b, the memory layer 114 and one conductive pattern 102b may serve as one memory cell C. Also, the pillar structure 121a, the memory layer 114 on the sidewalk in the second direction of the pillar structure 121a, the conductive patterns 102b of the odd and even conductive pattern structures may serve as a cell string. As the channel pattern 116b in the cell string may have the "U" shape, the memory cells formed on the channel pattern 116b may be arranged along the "U" shape.

The channel pattern 116b on the odd conductive pattern structure O may be electrically connected to a bit line contact and a bit line. The bit line may extend in the second direction crossing the word lines which extend in the first direction.

The channel pattern 116b on the even conductive pattern structure E may be electrically connected to a ground contact and a ground line.

In the conductive pattern structure 110a, the first portion 106a may be supported by the second portion 108a. Thus, although the number of levels of the conductive patterns 102b in the conductive pattern structure 110a may increase, the conductive pattern structure 110a may not lean. Without the support of the second portion 108a to the first portion 106a, the leaning of the conductive pattern structure 110a may occur during the process of forming the conductive pattern structure 110a. Thus, with the support of the second portion 108a to the first portion 106a, failures of the vertical semiconductor device due to the leaning of the conductive pattern structure 110a may decrease. For example, the bit line contact and the ground contact may be formed on the conductive pattern structure 110a without misalign. Thus, the vertical semiconductor device may have a stable structure.

FIGS. 8 to 21 are perspective views and plan views illustrating stages of a method of manufacturing a vertical semiconductor device in accordance with an example embodiment of the present inventive concept. Particularly, FIGS. 8, 9, 12, 14, 15, 20 and 21 are perspective views, and FIGS. 10, 11, 13, 16 to 19 are plan views.

Referring to FIG. 8, a lower insulation layer 101 may be formed on a substrate 100. Conductive layers 102 and insulation layers 104 may be alternately and repeatedly stacked on the lower insulation layer 101. The lower insulation layer 101 may include any suitable insulating material such as an oxide or a nitride. For example, the lower insulation layer 101 may include a thermal oxide. In an example embodiment of the present inventive concept, the conductive layers 102 may be formed of, e.g., polysilicon. In an example embodiment of the present inventive concept, the conductive layers 102 may be formed of a metal which may be easily removed by a dry etching process. For example, the conductive layers 102 may include, e.g., titanium (Ti), titanium nitride (TiN), tantalum (Ta), tantalum nitride (TaN), etc. In an example embodiment of the present inventive concept, the insulation layers 104 may be formed of oxide, e.g., silicon oxide ($SiO_2$), silicon oxycarbide (SiOC), borosilicate glass (SiOB), etc. The lower insulation layer 101 and the insulation layer 104 may include the same material.

Figure 9:
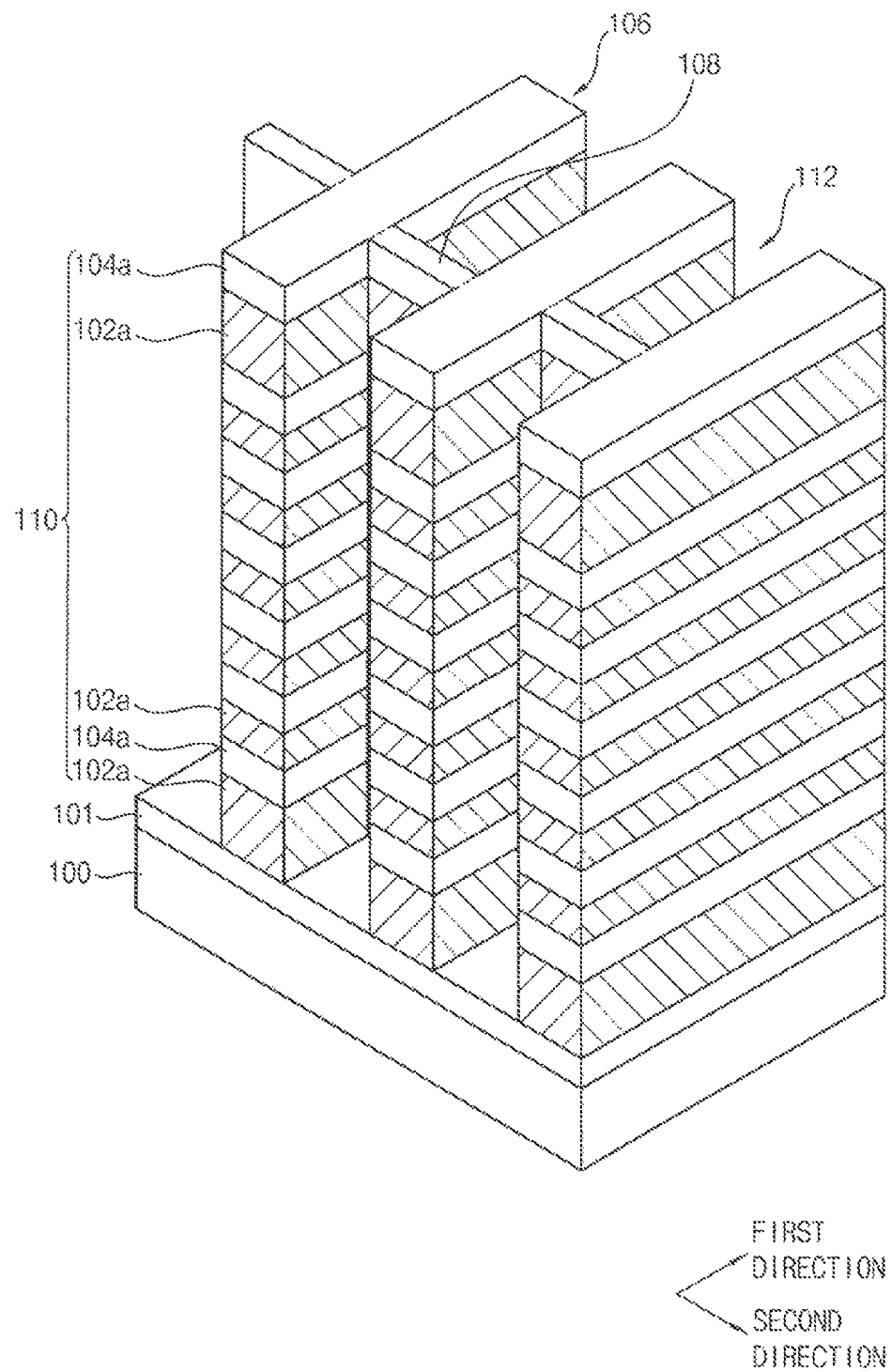
Figure 10:
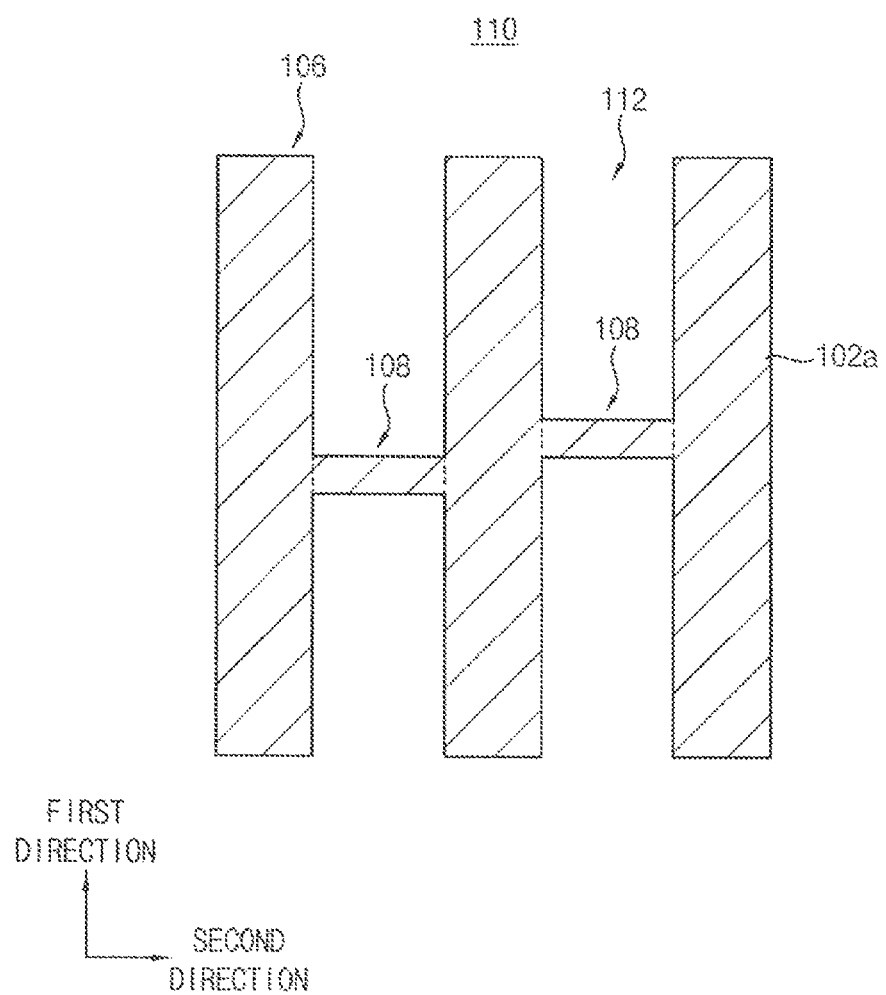
Figure 11:
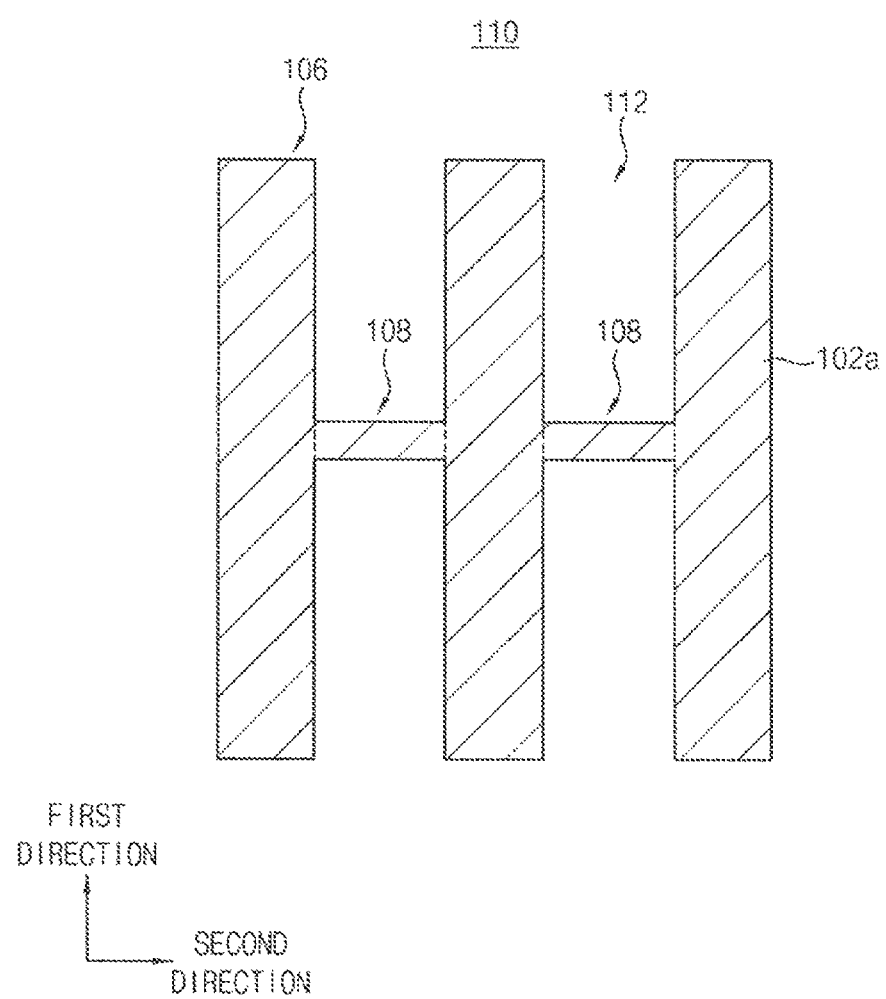

Referring to FIGS. 9 to 11, portions of the conductive layers 102 and the insulation layers 104 may be etched to form a preliminary conductive pattern structure 110 on the lower insulation layer 101. The preliminary conductive pattern structure 110 may include preliminary conductive patterns 102a and preliminary insulation patterns 104a alternatively stacked. The uppermost preliminary conductive pattern 102a may be thicker than the preliminary conductive patterns 102a under the uppermost preliminary conductive pattern 102a. However, the present inventive concept is not limited thereto. For example, all the preliminary conductive patterns 102a may have about equal thickness, or the uppermost and lowermost preliminary conductive patterns 102a may be thicker than the preliminary conductive patterns 102a therebetween.

The preliminary conductive pattern structure 110 may have first portions 106 extending in the first direction to have a line shape and a second portion 108 on sidewalls of the first portions 106. The second portion 108 may connect the first portions 106 to each other. The first portions 106 may be spaced apart from each other in the second direction.

In an example embodiment of the present inventive concept, a width in the first direction of the second portion 108 may be substantially the same as or different from a width in the second direction of the first portion 106. For example, the width in the first direction of the second portion 108 may be smaller than a width in the second direction of the first portion 106.

A trench 112 may be formed between the first portions 106, and the lower insulation layer 101 may be exposed by a bottom of the trench 112. The second portion 108 may be positioned at an edge portion in the first direction of the trench 112.

The preliminary conductive patterns 102a may serve as gate electrodes of the transistors included in the cell string by subsequent process.

In the preliminary conductive pattern structure 110, the first portion 106 may be supported by the second portion 108. As a result, when the preliminary conductive patterns 102a and the preliminary insulation patterns 104a are highly stacked, a leaning of the first portions 106 in the preliminary conductive pattern structure 110 may decrease. Thus, failures due to the leaning of the first portions 106 in the preliminary conductive pattern structure 110 may decrease.

In an example embodiment of the present inventive concept, as shown in FIGS. 9 and 10, the second portions 108 may be arranged not to be aligned in the second direction. For example, the second portions 108 formed on opposite sidewalls of the first portion 106 may not be arranged to be aligned in the second direction.

In an example embodiment of the present inventive concept, as shown in FIG. 11, the second portions 108 may be arranged to be aligned in the second direction. For example, the second portions 108 formed on opposite sidewalls of the first portion 106 may be arranged to be aligned in the second direction.

Figure 12:
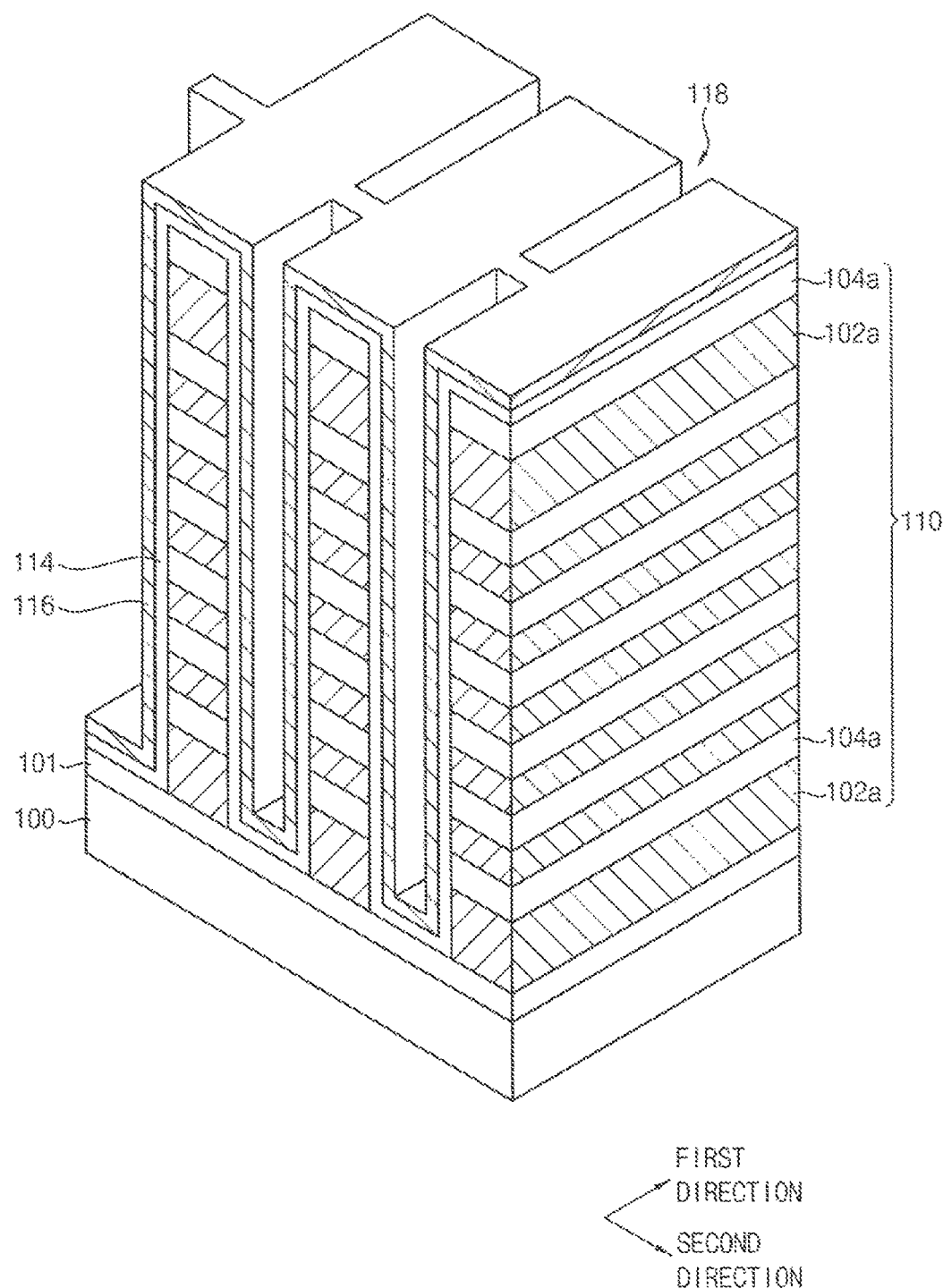
Figure 13:
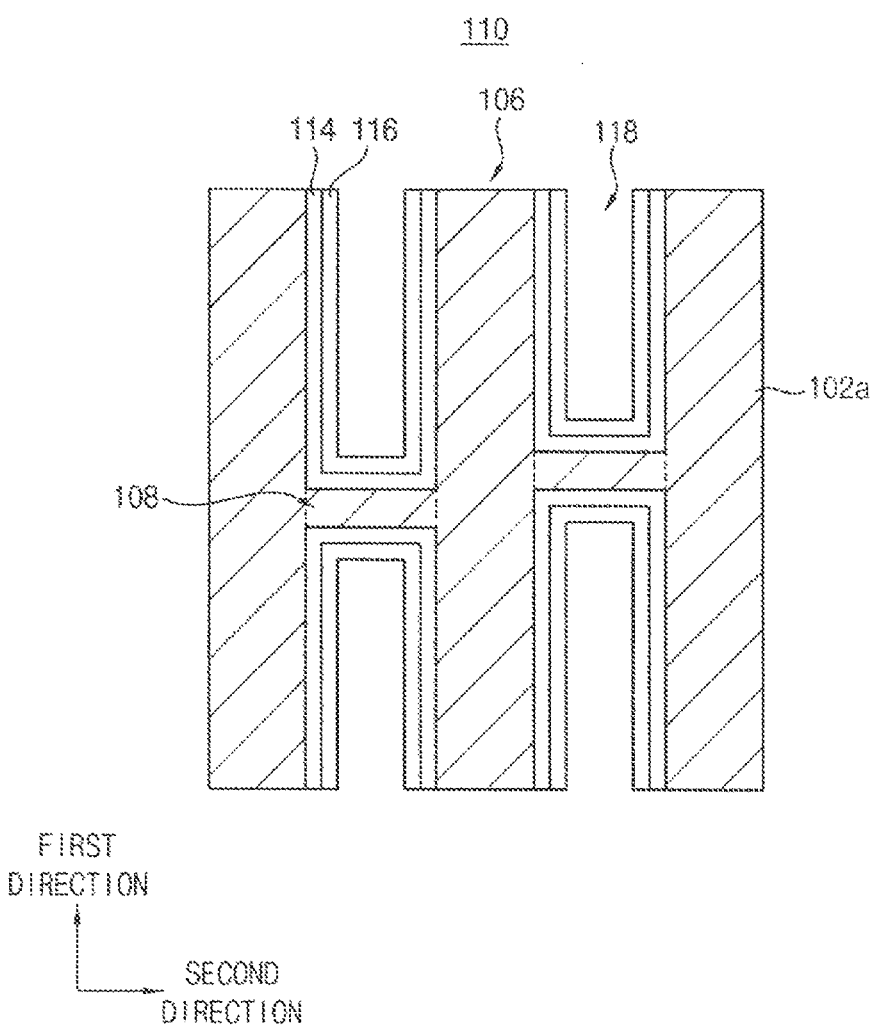

Referring to FIGS. 12 and 13, a memory layer 114 may be formed on surfaces of the preliminary conductive pattern structure 110 and the lower insulation layer 101. A channel layer 116 may be formed on the memory layer 114. The memory layer 114 and the channel layer 116 may be conformally formed on sidewalls and upper surfaces of the first and second portions 106 and 108 of the preliminary conductive pattern structure 110, and an upper surface of the lower insulation layer 101 exposed in the trench 112. After forming the channel layer 116, a gap 118 may be formed by the channel layer 116 formed on sidewalk of the first and the second portions 106 and 108.

In an example embodiment of the present inventive concept, as shown in FIG. 6A, the memory layer 114 may be formed to include a blocking dielectric layer 114c, a charge storage layer 114b and a tunnel insulation layer 114a sequentially stacked, and here in FIG. 12 on the surfaces of the preliminary conductive pattern structures 110 and the lower insulation layer 101. For example, the memory layer 114 may include a silicon oxide ($SiO_2$) layer, a silicon nitride ($Si_3N_4$) layer and a silicon oxide ($SiO_2$) layer sequentially stacked on the surfaces of the preliminary conductive pattern structures 110 and the lower insulation layer 101.

In an example embodiment of the present inventive concept, as shown in FIG. 6B, the memory layer 114 may be formed to include a blocking dielectric layer 114c, an etch stop layer 114d, a charge storage layer 114b and a tunnel insulation layer 114a sequentially stacked, and here in FIG. 12 on the surfaces of the preliminary conductive pattern structures 110 and the lower insulation layer 101. For example, the memory layer may include a silicon oxide ($SiO_2$) layer, a metal oxide layer, a silicon nitride ($Si_3N_4$) layer and a silicon oxide ($SiO_2$) layer sequentially stacked on the surfaces of the preliminary conductive pattern structures 110 and the lower insulation layer 101. The metal oxide layer may serve as the etch stop layer 114d, and may include, e.g., aluminum oxide ($Al_2O_3$).

The channel layer 116 may include, e.g., polysilicon.

Figure 14:
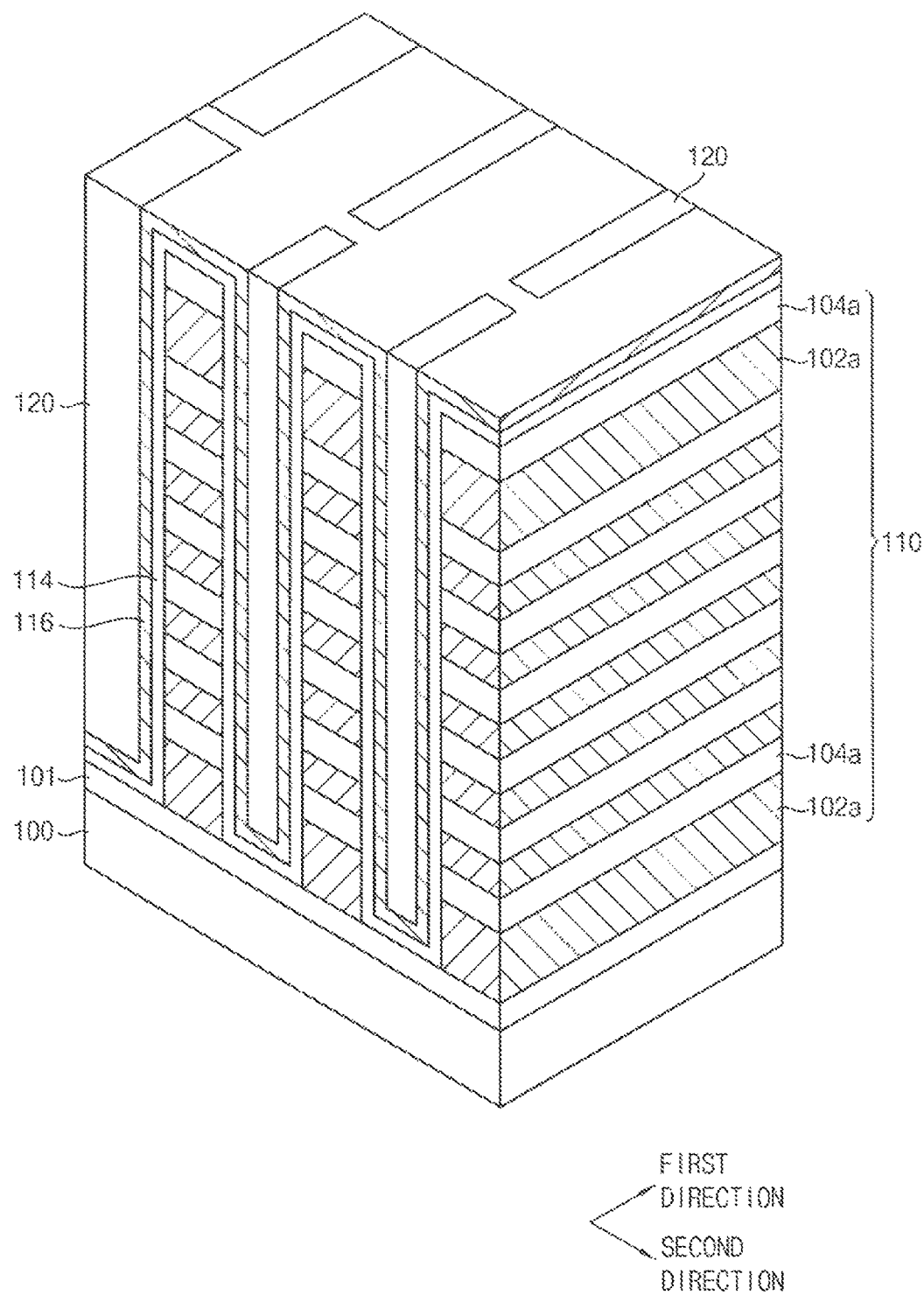
Figure 15:
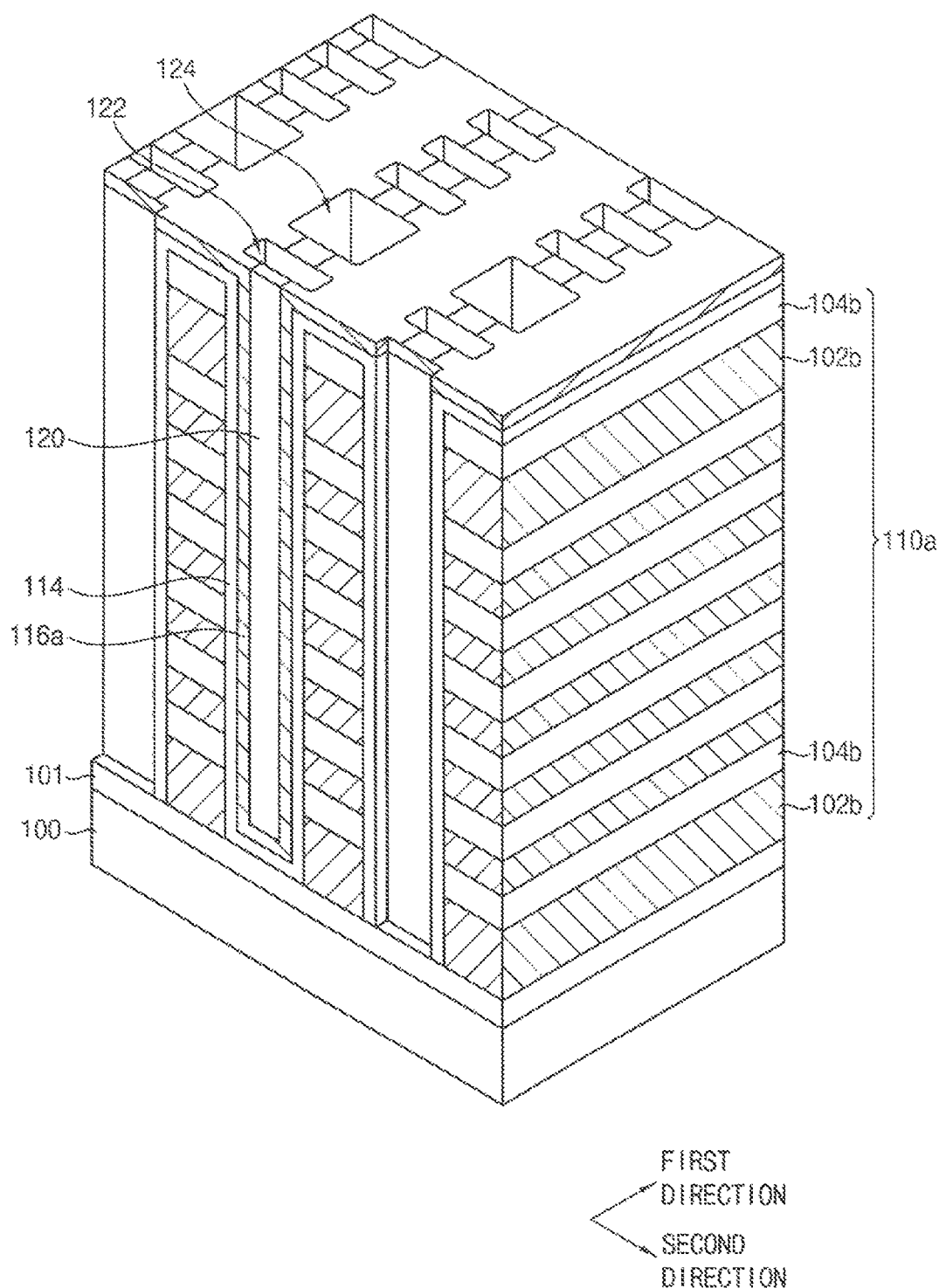

Referring to FIG. 14, a first insulation pattern 120 may be formed to fill the gap 118. In an example embodiment of the present inventive concept, the first insulation pattern 120 may be formed to include silicon oxide (SiO$_2$).

In an example embodiment of the present inventive concept, an insulation layer may be formed on the channel layer 116 to sufficiently fill the gap 118, and an upper portion of the insulation layer may be planarized to form the first insulation pattern 120.

In an example embodiment of the present inventive concept, an insulation layer may be formed on the channel layer 116 to fill an upper portion of the gap 118, and an upper portion of the insulation layer may be planarized to form the first insulation pattern 120. In this case, the first insulation pattern 120 may be only formed at the upper portion of the gap 118. The first insulation pattern 120 may not fill a lower portion of the gap 118, so that the lower portion of the gap 118 may serve as an air gap.

Referring to FIGS. 15 to 19, an etching mask may be formed on the channel layer 116 and the first insulation pattern 120. The channel layer 116, the first insulation pattern 120, the second portion 108 of the preliminary conductive pattern structure 110 may be etched to form first cutting holes 122 and second cutting holes 124 exposing the surface of the lower insulation layer 101. The memory layer 114 may also be etched in the forming of the first cutting holes 122 and the second cutting holes 124.

The first cutting holes 122 may be formed in the trench 112 (refer to FIG. 9), and may be spaced apart from each other. During the etching process for forming the first cutting holes 122, the first insulation pattern 120 and the channel layer 116 may be etched together. The channel layer 116 formed on the sidewall of the first portion 106 and the lower insulation layer 101 may be separated by the first cutting holes 122, so that a preliminary channel pattern 116a may be formed on the memory layer 114. The memory layer 114 may not be etched, or some of the layers included in the memory layer 114 may also be etched in the forming of the first cutting holes 122. The preliminary channel pattern 116a may have a "U" shape in the trench 112 (refer to FIG. 9). The preliminary channel patterns 116a may be spaced apart from each other in the first direction in the trench 112 (refer to FIG. 9). The preliminary channel patterns 116a may be still connected in the first direction on the upper surface of the conductive pattern structure 110a at this stage.

A preliminary pillar structure 121 including the first insulation pattern 120 and the preliminary channel pattern 116a may be formed between the first cutting holes 122. Memory cells may be formed on a sidewall of the preliminary pillar structure 121 by subsequent processes. The memory cells formed on the preliminary pillar structure 121 may serve as a cell string.

Figure 16:
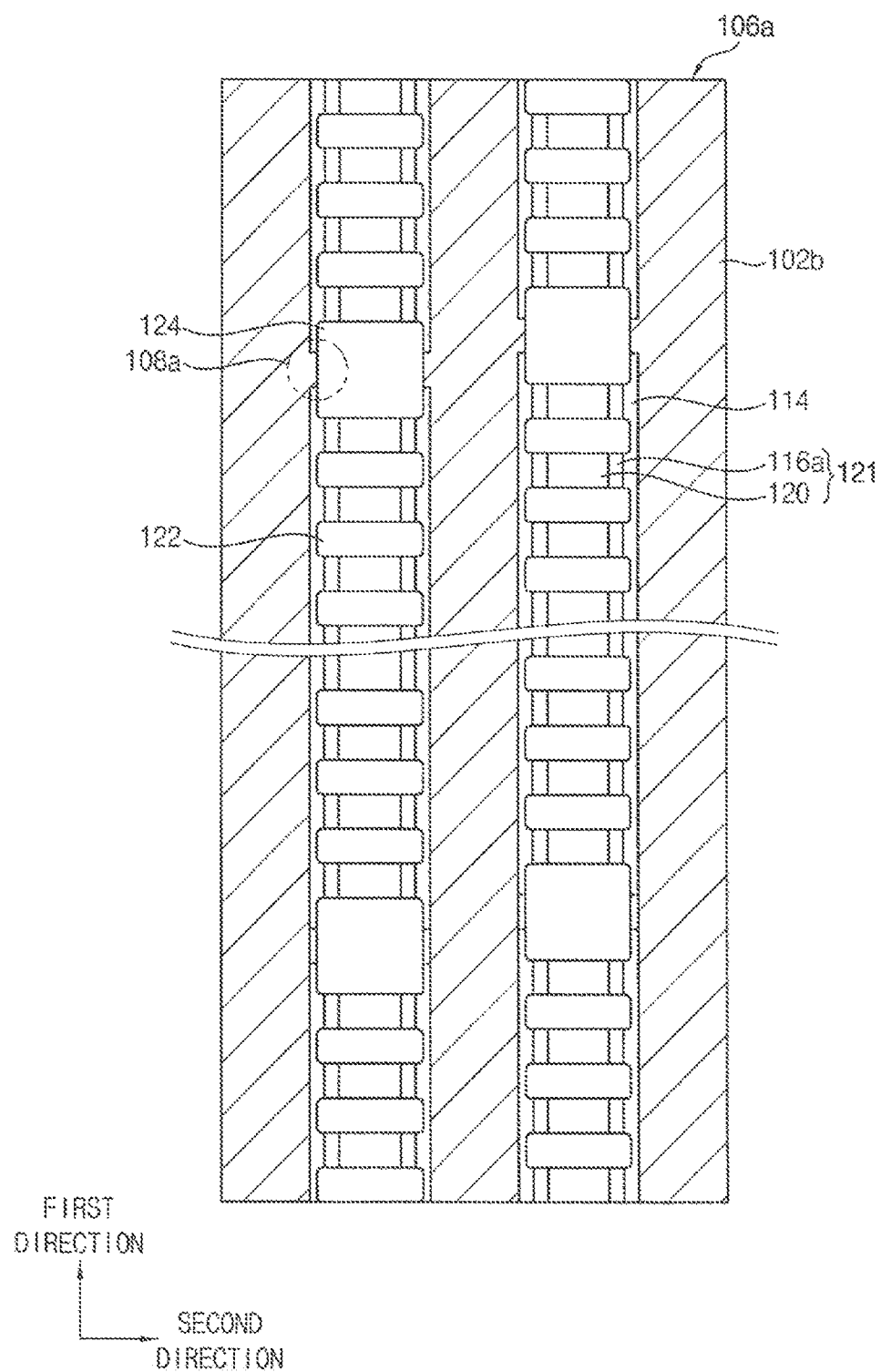
Figure 17:
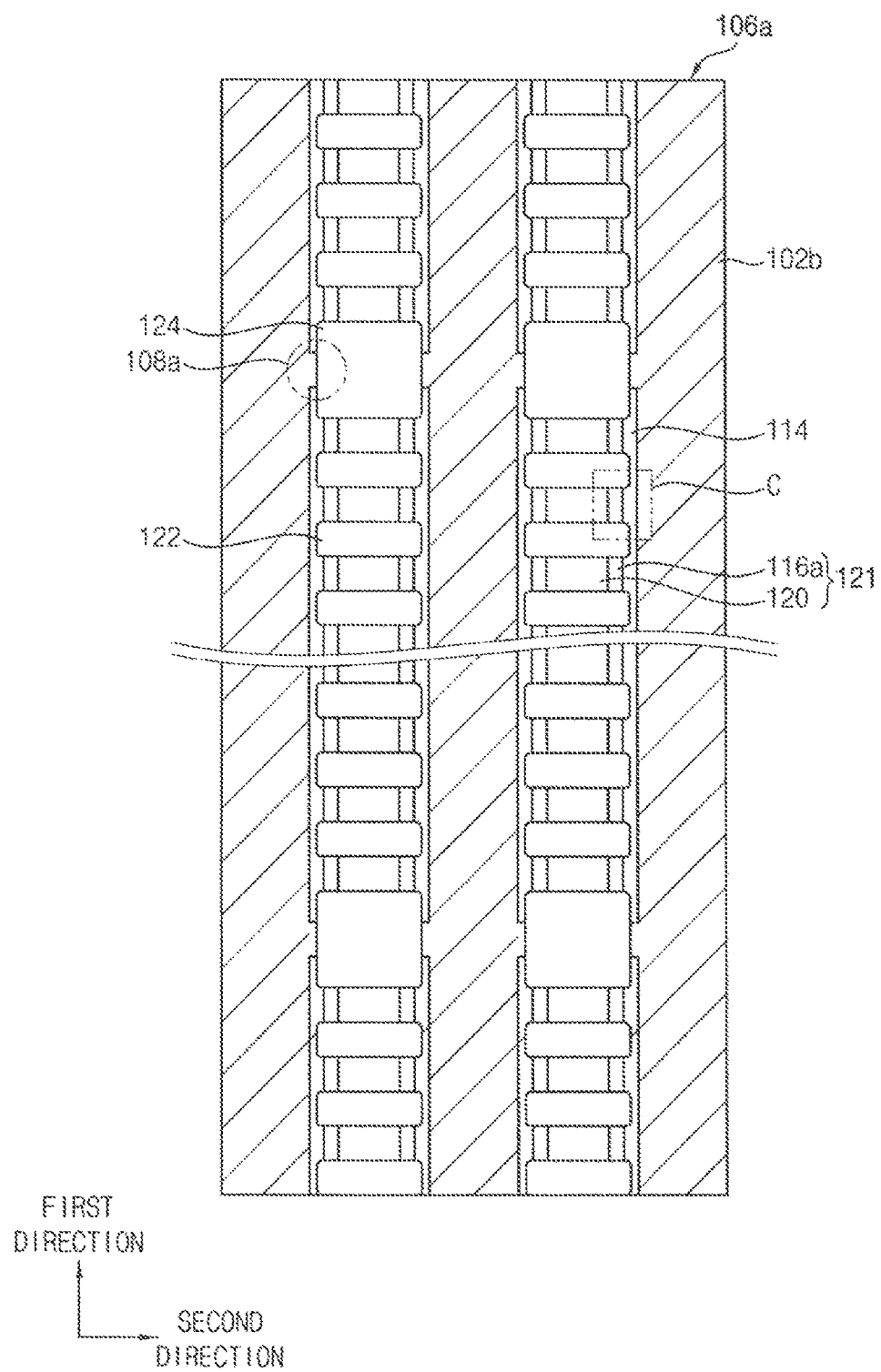
Figure 18:
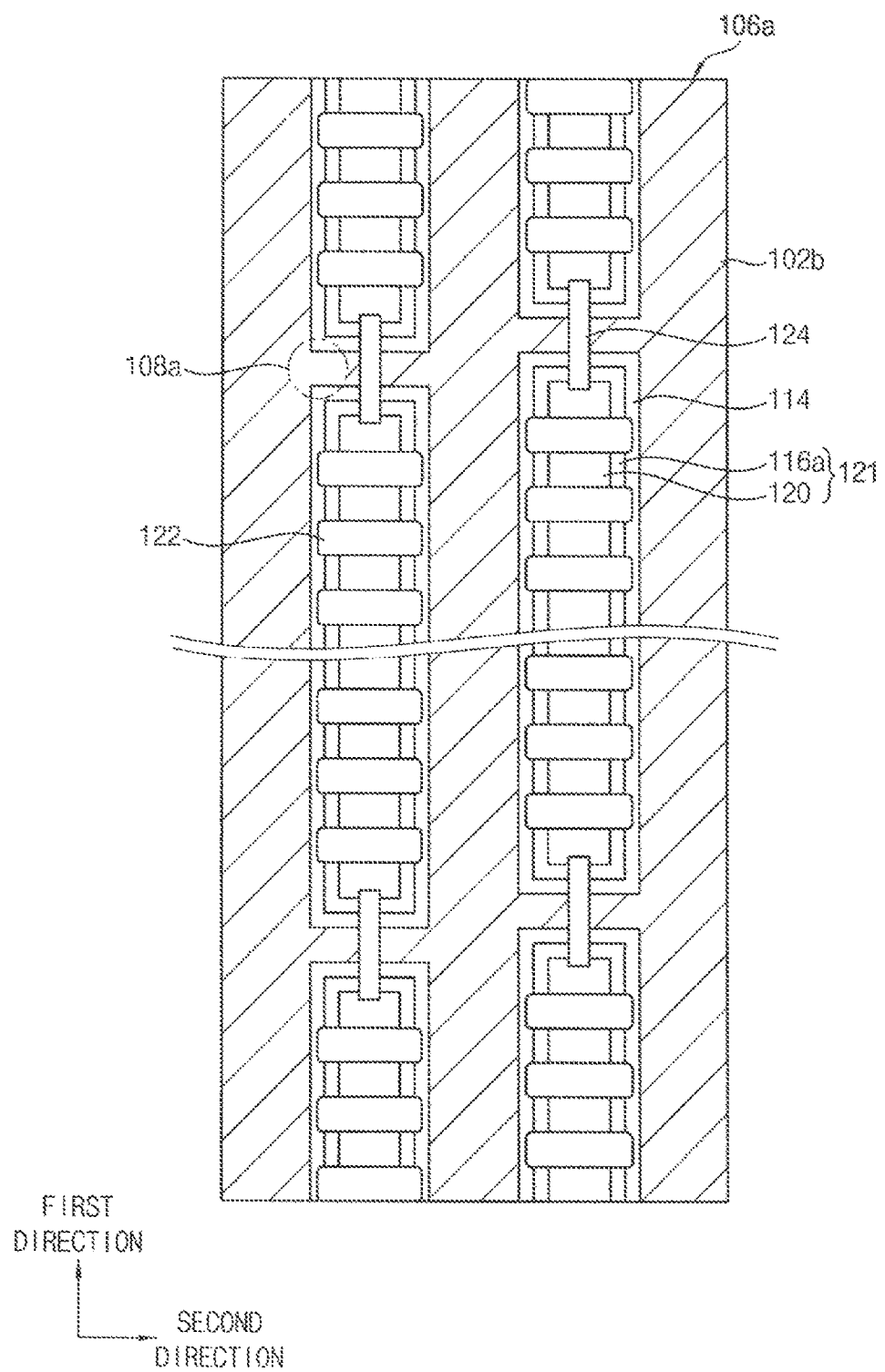
Figure 19:
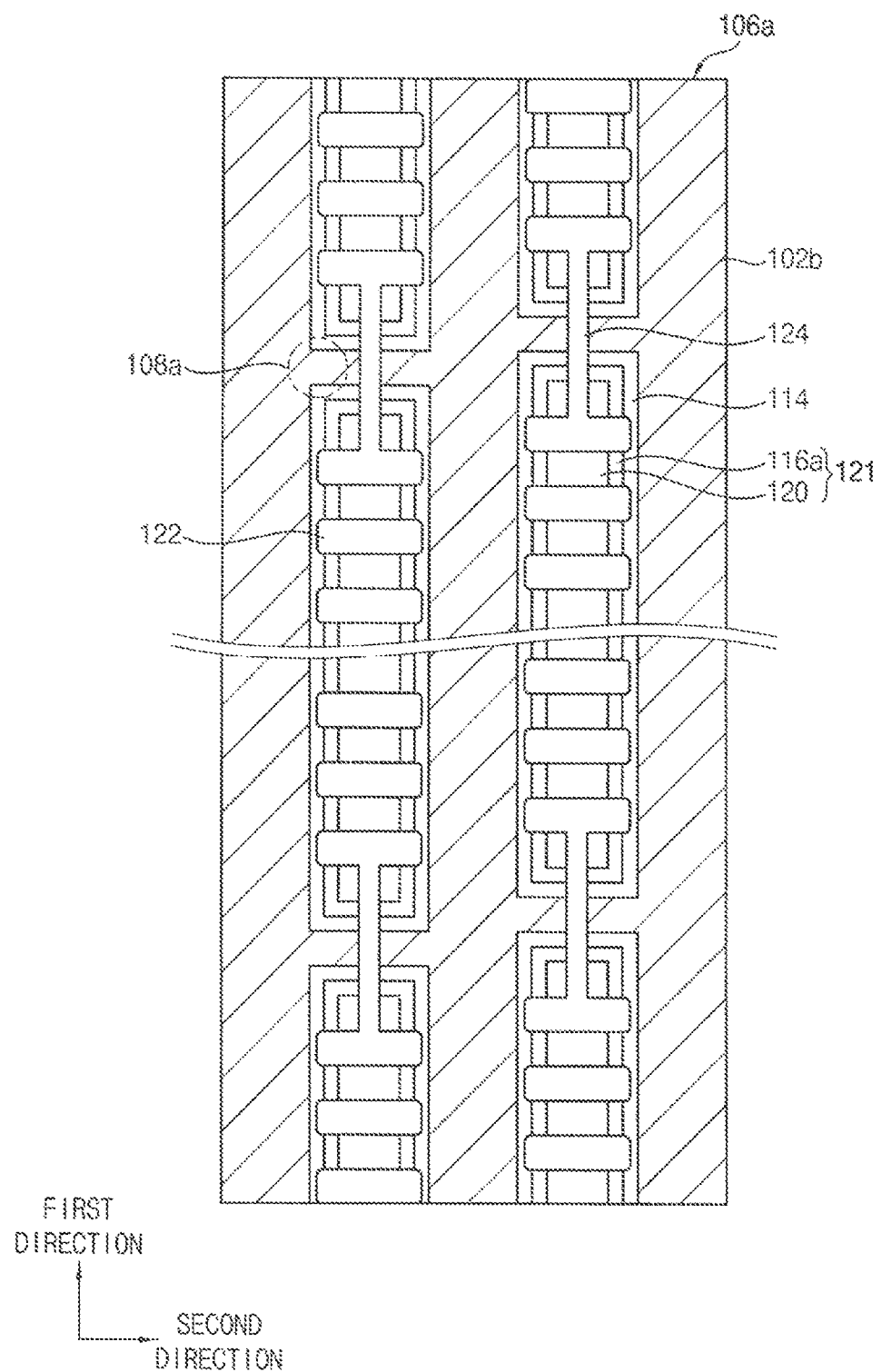

In an example embodiment of the present inventive concept, as shown in FIGS. 16, 18 and 19, the first cutting holes 122 may be disposed in a zig zag fashion in the second direction. In an example embodiment of the present inventive concept, as shown in FIG. 17, the first cutting holes 122 may be aligned in the second direction.

The second portion 108 of the preliminary conductive pattern structure 110 and the memory layer 114 and the channel layer 116 on the sidewall of the second portion 108 may be removed to form the second cutting holes 124. The second portion 108 of the preliminary conductive pattern structure 110 may be divided by the second cutting holes, so that a conductive pattern structure 110a may be formed on the lower insulation layer 101. The conductive pattern structure 110a may extend in the first direction. The channel layer 116 and the memory layer 114 on the second portion 108 of the preliminary conductive pattern structure 110 may be cut by the second cutting hole 124.

The conductive pattern structure 110a may include a first portion 106a extending in the first direction and a second portion 108a protruding from a sidewall of the first portion 106a. The second portions 108a of two neighboring ones of the conductive pattern structures 110a may be opposite to each other. Thus, the second portions 108a of two neighboring ones of the conductive pattern structures 110a may be aligned in the second direction.

A width in the first direction of the second cutting hole 124 may be greater than a width in the first direction of the first cutting hole 122. A portion of the conductive pattern structure 110a may be exposed by the sidewall in the second direction of the second cutting hole 124. For example, the second portion 108a of the conductive pattern structure 110a may be exposed by the sidewall in the second direction of the second cutting hole 124.

In an example embodiment of the present inventive concept, as shown in FIGS. 16 and 17, the width in the second direction of the second cutting hole 124 may be greater than a width in the second direction of the first cutting hole 122. The first and second cutting holes 122 and 124 may be spaced apart from each other.

In an example embodiment of the present inventive concept, as shown in FIG. 18, the width in the second direction of the second cutting hole 124 may be smaller than a width in the second direction of the first cutting hole 122. The first and second cutting holes 122 and 124 may be spaced apart from each other.

In an example embodiment of the present inventive concept, as shown in FIG. 19, the width in the second direction of the second cutting hole 124 may be smaller than a width in the second direction of the first cutting hole 122. The second cutting hole 124 may be connected to the first cutting hole 122 neighboring the second cutting hole 124 in the first direction. For example, one second cutting hole 124 may be connected to two first cutting holes 122.

During the etching process for forming the first cutting holes 122, at least the channel layer 116 may be removed. The memory layer 114 may or may not be etched. Preferably, the channel layer 116, and the tunnel insulation layer 114a and the charge storage layer 114b of the memory layer 114 may be etched by the etching process. Thus, as shown in FIGS. 7A and 7B, the blocking dielectric layer 114c may remain after the etching process. In this case, damages of the preliminary conductive patterns 102a due to the etching process may decrease.

In an example embodiment of the present inventive concept, as shown in FIG. 7A, the channel layer 116, the tunnel insulation layer 114a and the charge storage layer 114b may be etched to expose the blocking dielectric layer 114c on the sidewall of the first cutting hole 122. In an example embodiment of the present inventive concept, the channel layer 116 and the tunnel insulation layer 114a may be anisotropically etched, and then the charge storage layer 114b may be isotropically etched to expose the etching stop layer 114d. In this case, as shown in FIG. 7B, the etch stop layer 114d may be etched to be exposed by the sidewall of the first cutting hole 122.

In an example embodiment of the present inventive concept, the channel layer 116 may be etched to expose the tunnel insulation layer 114a on the sidewall of the first cutting hole 122. That is, the memory layer 114 may not be etched in the forming of the first cutting holes 122.

The preliminary channel pattern 116a on the conductive pattern structure 110a may be connected in the first direction. For example, the preliminary channel pattern 116a on the upper surface of the conductive pattern structure 110a may not be etched, and may extend in the first direction on top of the conductive pattern structure 110a. In other words, the first cutting hole 122 and the second cutting hole 124 may not be formed on the potion of the preliminary channel pattern 116a overlapping the conductive pattern structure 110a in the vertical direction.

In an example embodiment of the present inventive concept, all or some of the preliminary channel patterns 116a in the trench 112 (refer to FIG. 9) may have substantially the same width. All or some of distances between the preliminary channel patterns 116a in the trench 112 (refer to FIG. 9) may be substantially the same.

Figure 20:
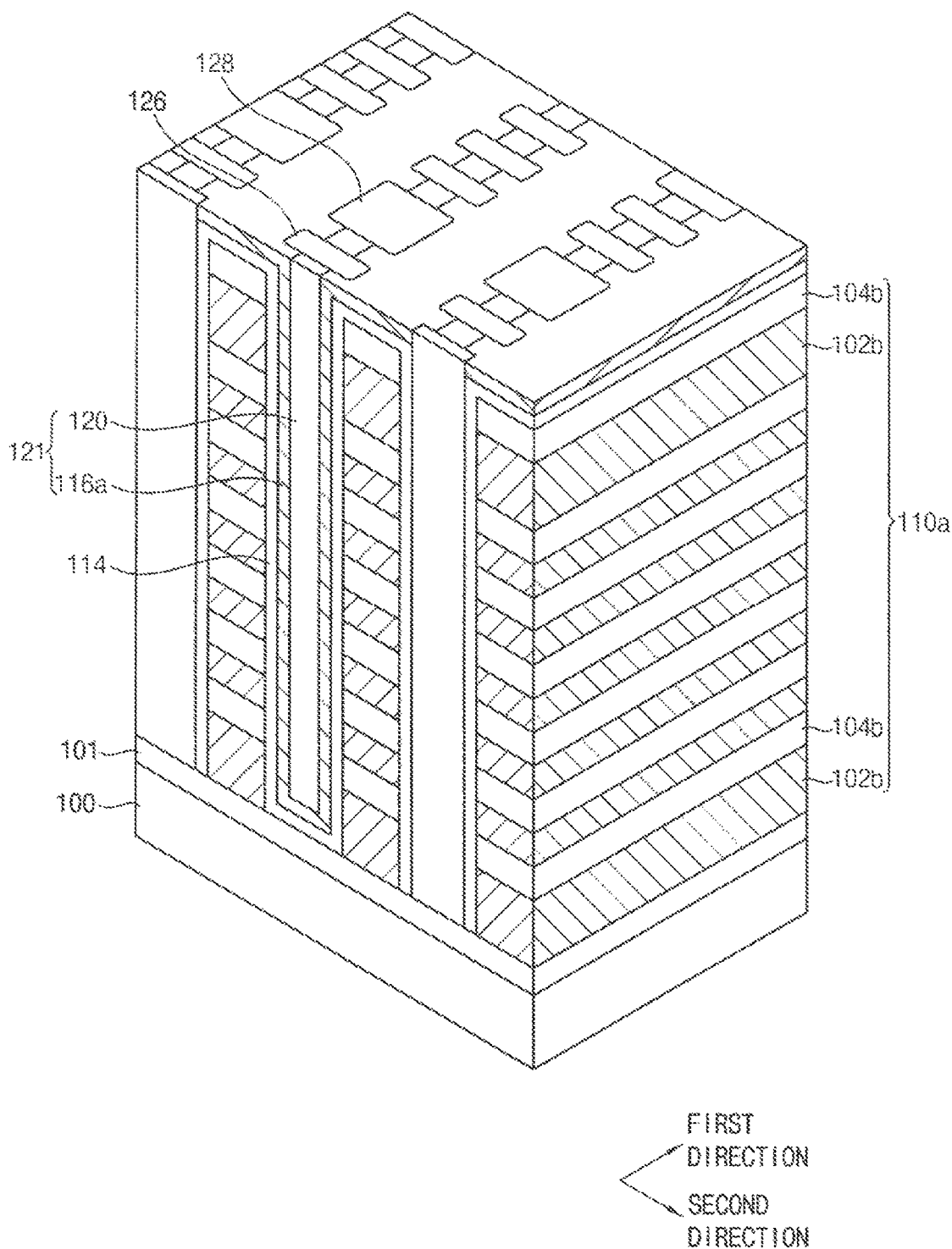

Referring to FIG. 20, a second insulation pattern 126 may be formed to fill each of the first cutting holes 122, and a third insulation pattern 128 may be formed to fill each of the second cutting holes 124.

In an example embodiment of the present inventive concept, an insulation layer may be formed on the preliminary channel pattern 116a and the first insulation pattern 120 to sufficiently fill the first and second cutting holes 122 and 124. An upper surface of the insulation layer may be planarized to form the second insulation patterns 126 and the third insulation patterns 128. Thus, the second and third insulation patterns 126 and 128 may include substantially the same material, In an example embodiment of the present inventive concept, the second and third insulation patterns 126 and 128 may include, e.g., silicon oxide (SiO$_2$).

In an example embodiment of the present inventive concept, an insulation layer may be formed on the preliminary channel pattern 116a and the first insulation pattern 120 to fill upper portions of the first and second cutting holes 122 and 124. An upper surface of the insulation layer may be planarized to form the second insulation patterns 126 and the third insulation patterns 128. In this case, the insulation layer may not fill lower portions of the first and second cutting holes 122 and 124, so that lower portions of the first and second cutting holes 122 and 124 may each serve as an air gap. The second and the third insulation patterns 126 and 128 may be formed to only fill the upper portions of the first and second cutting holes 122 and 124, respectively.

A shape of the second insulation pattern 126 may vary depending on a shape of the first cutting hole 122, and a shape of the third insulation pattern 128 may vary depending on a shape of the second cutting hole 124.

A width in the first direction of the third insulation pattern 128 may be greater than a width in the first direction of the second insulation pattern 126.

FIGS. 2 and 3 may correspond to FIGS. 16 and 17, respectively, except FIGS. 16 and 17 may represent the stage before the forming of the second insulation patterns 126 and the third insulation patterns 128, and FIGS. 2 and 3 may represent the stage after the forming of the second insulation patterns 126 and the third insulation patterns 128. In an example embodiment of the present inventive concept, as shown in FIGS. 2 and 3, the width in the second direction of the third insulation pattern 128 may be substantially the same as a width in the second direction of the second insulation pattern 126.

FIGS. 4 and 5 may correspond to FIGS. 18 and 19, respectively, except FIGS. 18 and 19 may represent the stage before the forming of the second insulation patterns 126 and the third insulation patterns 128, and FIGS. 4 and 5 may represent the stage after the forming of the second insulation patterns 126 and the third insulation patterns 128. In an example embodiment of the present inventive concept, as shown in FIGS. 4 and 5, the width in the second direction of the third insulation pattern 128 may be smaller than a width in the second direction of the second insulation pattern 126.

In an example embodiment of the present inventive concept, as shown in FIG. 5, the width in the second direction of the third insulation pattern 128 may be smaller than a width in the second direction of the second insulation pattern 126, and the third insulation pattern 128 may contact the second insulation pattern 126 neighboring the third insulation pattern 128 in the first direction. In the plan view, the third insulation pattern 128 and two of the second insulation patterns 126 neighboring the third insulation pattern 128 in the first direction may have an "I" shape.

Figure 21:
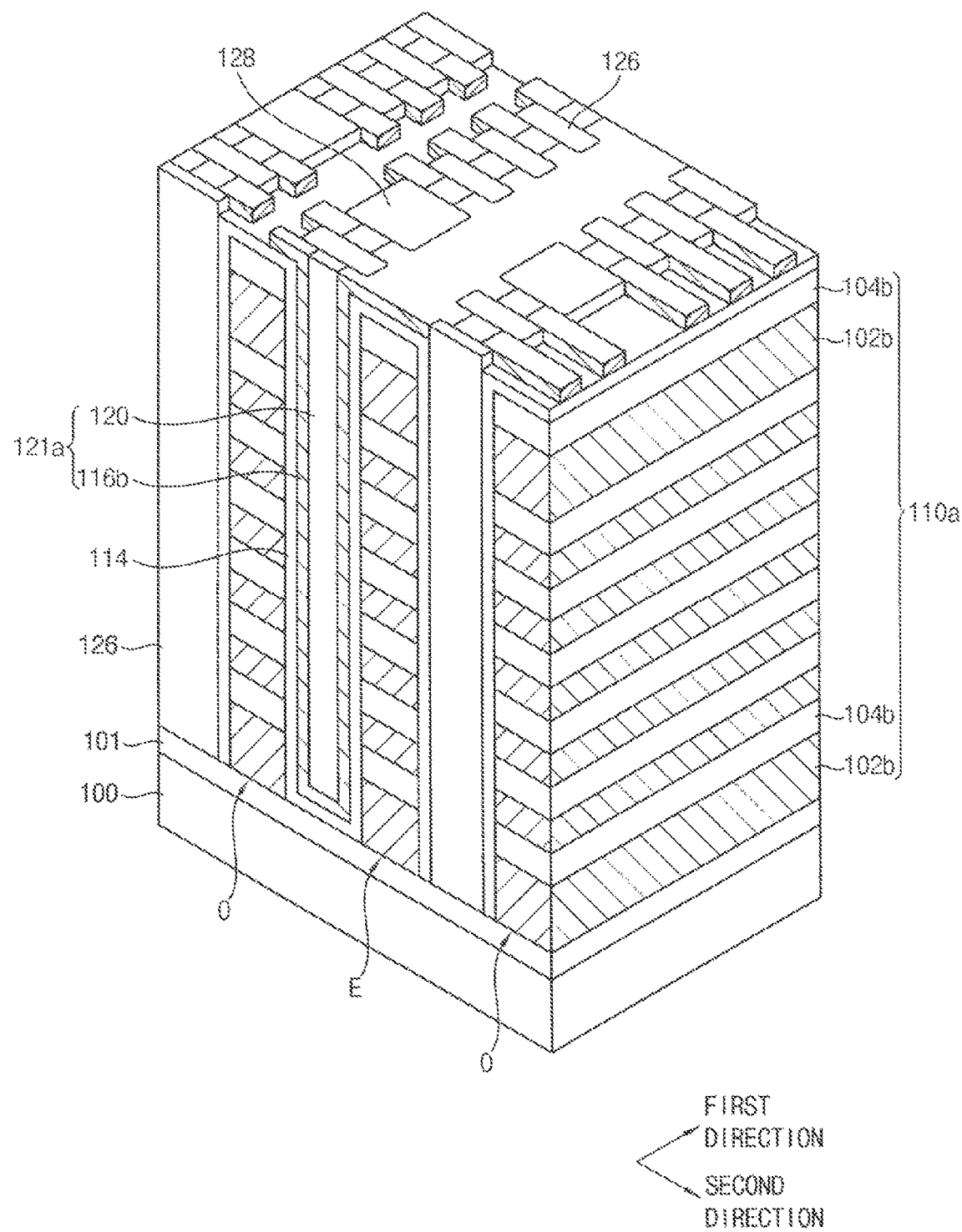

Referring to FIG. 21, the preliminary channel pattern 116a on the conductive pattern structure 110a may be partially etched to form a channel pattern 116b. Also, a pillar structure 121a including the first insulation pattern 120 and the channel pattern 116b may be formed.

A first group of pillar structures may be disposed at sidewalls in the first direction of the third insulation patterns 128. The first group of pillar structures may include a plurality of pillar structures 121a spaced apart from each other in the first direction, and the second insulation pattern 126 disposed between the pillar structures 121a. A plurality of first groups of pillar structures may be arranged in the first direction, and may be separated from each other by the third insulation pattern 128.

As the width in the first direction of the third insulation pattern 128 is greater than the width in the first direction of the second insulation pattern 126, a distance between two neighboring ones of the first groups of pillar structures may be greater than the distance between two neighboring ones of the pillar structures 121a in the first group of the pillar structures.

The conductive pattern structures 110a may include even conductive pattern structures E and odd conductive pattern structures O. The preliminary channel pattern 116a may be formed on upper surfaces and sidewalls of the even and odd conductive pattern structures E and O and the lower insulation layer 101 between the even and odd conductive pattern structures E and O.

Referring to FIG. 21, the preliminary channel pattern 116a on the odd conductive pattern structure O may be etched in the first and second directions to be separated from each other, so that the channel patterns 116b may be formed. For example, the portion of the preliminary channel pattern 116a extending in the first direction over the upper surface of the odd conductive pattern structure O may be etched. Thus, the channel patterns 116b on the odd conductive pattern structure O may be spaced apart from each other in the first direction. The channel patterns 116b on the odd conductive pattern structure O may also be spaced apart from each other in the second direction.

The preliminary channel pattern 116a on the even conductive pattern structure E may not be etched, so that the channel pattern 116b on the even conductive pattern structure E may be connected in the first direction. For example, the portion of the channel pattern 116b over the upper surface of the even conductive pattern structure E may extend in the first direction without being etched.

In the case described above, the channel pattern 116b on the odd conductive pattern structure O may be electrically connected to a string selection transistor (SST), and the channel pattern 116b on the even conductive pattern structure E may be electrically connected to a ground selection transistor (GST).

The cell string including the pillar structure 121a, the memory layer 114 on the sidewalls in the second direction of the pillar structure 121a, and the conductive patterns 102b of the odd and even conductive pattern structures O and E may be formed. In the cross-sectional view, the channel pattern 116b in the cell string may have a "U" shape. The conductive patterns 102b of the odd and even conductive pattern structures O and E may serve as gates of transistors in the cell string. As the channel pattern 116b in the cell string may have the "U" shape, the memory cells formed on the channel pattern 116b may be arranged along the "U" shape.

A bit line contact may be formed on the channel patterns 116b on the odd conductive pattern structure O. A bit line may be formed on the bit line contact, and may extend in the second direction crossing the word lines which extend in the first direction. A ground contact may be formed on the channel patterns 116b on the even conductive pattern structure E. A ground line may be formed on the ground contact.

As described above and shown in FIG. 9, the second portion 108 of the preliminary contact pattern structure 110 may support the first portion 106 of the preliminary contact pattern structure 110, so that the leaning of the first portion 106 may decrease. That is, the leaning of the conductive pattern structure 110a may decrease, so that pillar structures 121a between the conductive pattern structures 110a may be stably formed. Thus, failures due to the leaning of the conductive pattern structure 110a may decrease.

Figure 22:
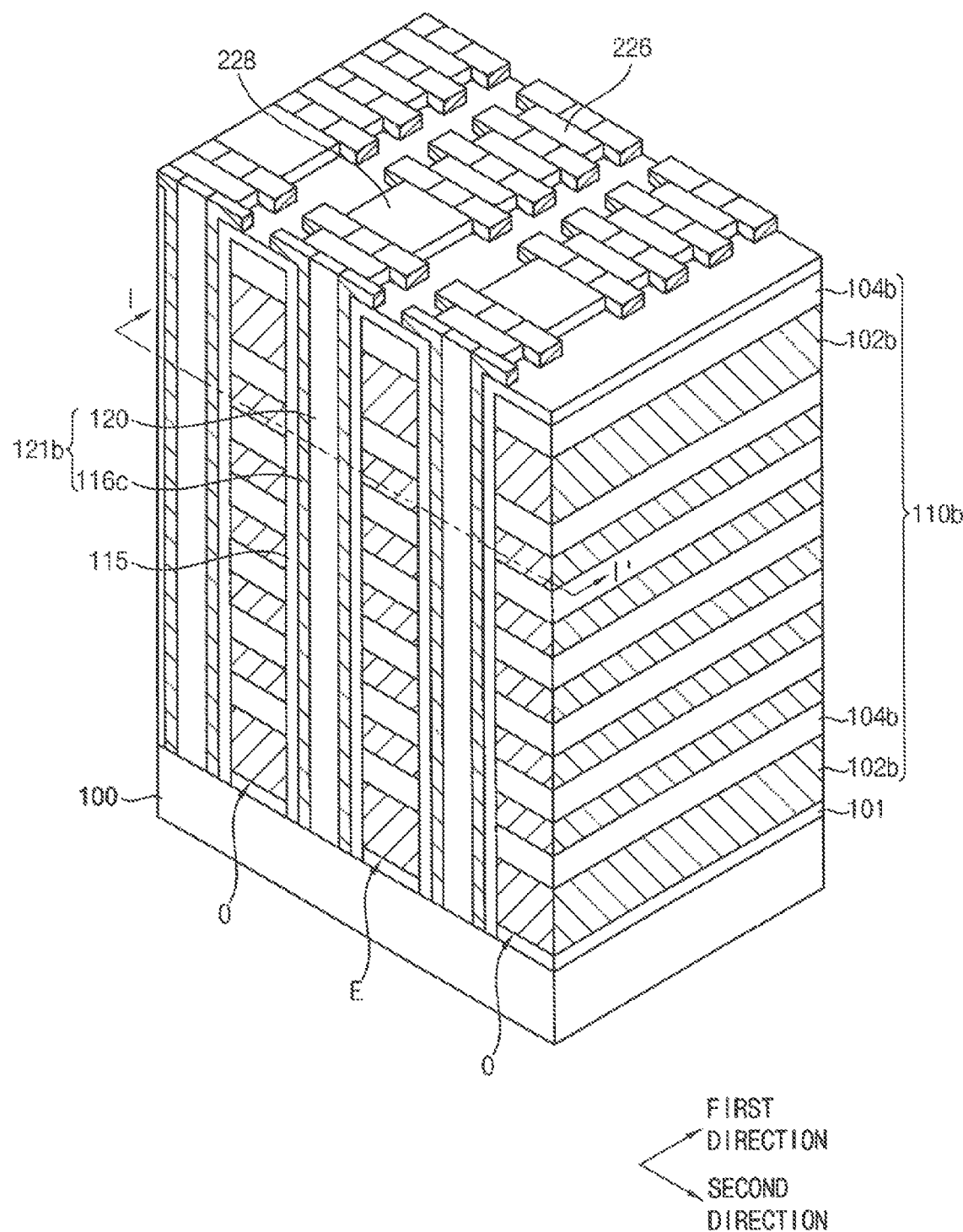
FIG. 22 is a perspective view illustrating a vertical semiconductor device in accordance with an example embodiment of the present inventive concept.

FIG. 22 is a perspective view illustrating a vertical semiconductor device in accordance with an example embodiment of the present inventive concept.

The vertical semiconductor device of FIG. 22 may be substantially the same as or similar to that illustrated in FIG. 1, except for shapes of the channel pattern and the memory layer.

In an example embodiment of the present inventive concept, a plan view of a portion taken along line I-I' of FIG. 22 may be substantially the same as FIG. 3, and with variations, may be illustrated as one of FIGS. 2, 4 and 5.

Referring to FIG. 22, a channel pattern 116c may not have a "U" shape but may have a pillar shape extending in a vertical direction from a surface of the substrate 100. The channel pattern 116c may contact the surface of the substrate 100.

The conductive pattern structure 110b may be formed on the lower insulation layer 101, and may include conductive patterns 102b and insulation patterns 104b alternatively and repeatedly stacked.

The memory layer 115 may be formed on a sideman of the conductive pattern structure 110b. The channel patterns 116c may be formed on a surface of the memory layer 115 and an upper surface of the conductive pattern structure 110b. The channel patterns 116c on the conductive pattern structure 110b may not be connected to each other. For example, the channel patterns 116c on the odd and even conductive pattern structures O and E may be spaced apart from each other in the first direction. The channel patterns 116c on the odd and even conductive pattern structures O and E may also be spaced apart from each other in the second direction.

An uppermost conductive pattern 102b of the conductive pattern structure 110b may serve as a string selection line (SSL). A lowermost conductive pattern 102b of the conductive pattern structure 110b may serve as a ground selection line (GSL). Conductive patterns 102b between the SSL and GSL may serve as word lines of the memory cells, respectively.

The channel pattern 116c, the memory layer 115, and one of the conductive patterns 102b may serve as a memory cell. Also, the memory layer 115 and the conductive patterns 102b on the channel pattern 116c having a pillar shape may serve as a cell string. In a cross-sectional view, the cell string may extend in the vertical direction.

The vertical semiconductor device may be manufactured by performing processes substantially the same as or similar to those illustrated with reference to FIGS. 8 to 19.

In the process for forming the preliminary conductive pattern structure 110, the conductive layers 102, the insulation layers 104 and the lower insulation layer 101 may be partially etched to form a trench. Thus, the surface of the substrate 100 may be exposed by the trench between the preliminary conductive pattern structures 110. The trench described here exposes the substrate 100 while the trench 112 in FIG. 9 exposes the lower insulation layer 101.

In the process illustrated with reference to FIG. 12, the memory layer 115 described here with reference to FIG. 22 may be formed to expose the substrate 100 by a bottom of the trench. Also, the channel layer 116 may be formed to expose the substrate 100 by a bottom of the trench. That is, the memory layer 115 may be formed on a sidewall of the preliminary conductive pattern structure 110. The channel layer 116 may be formed on the memory layer 115 and an upper surface of the preliminary conductive pattern structure 110.

In the process illustrated with reference to FIG. 22, the preliminary channel pattern 116a may be patterned to form the channel patterns 116c. In this case, the channel patterns 116c formed on the conductive pattern structure 110b may be spaced apart from each other in the first and second directions. That is, the channel patterns 116c on the odd and even conductive pattern structures O and E may be spaced apart from each other in the first and second directions.

Figure 23:
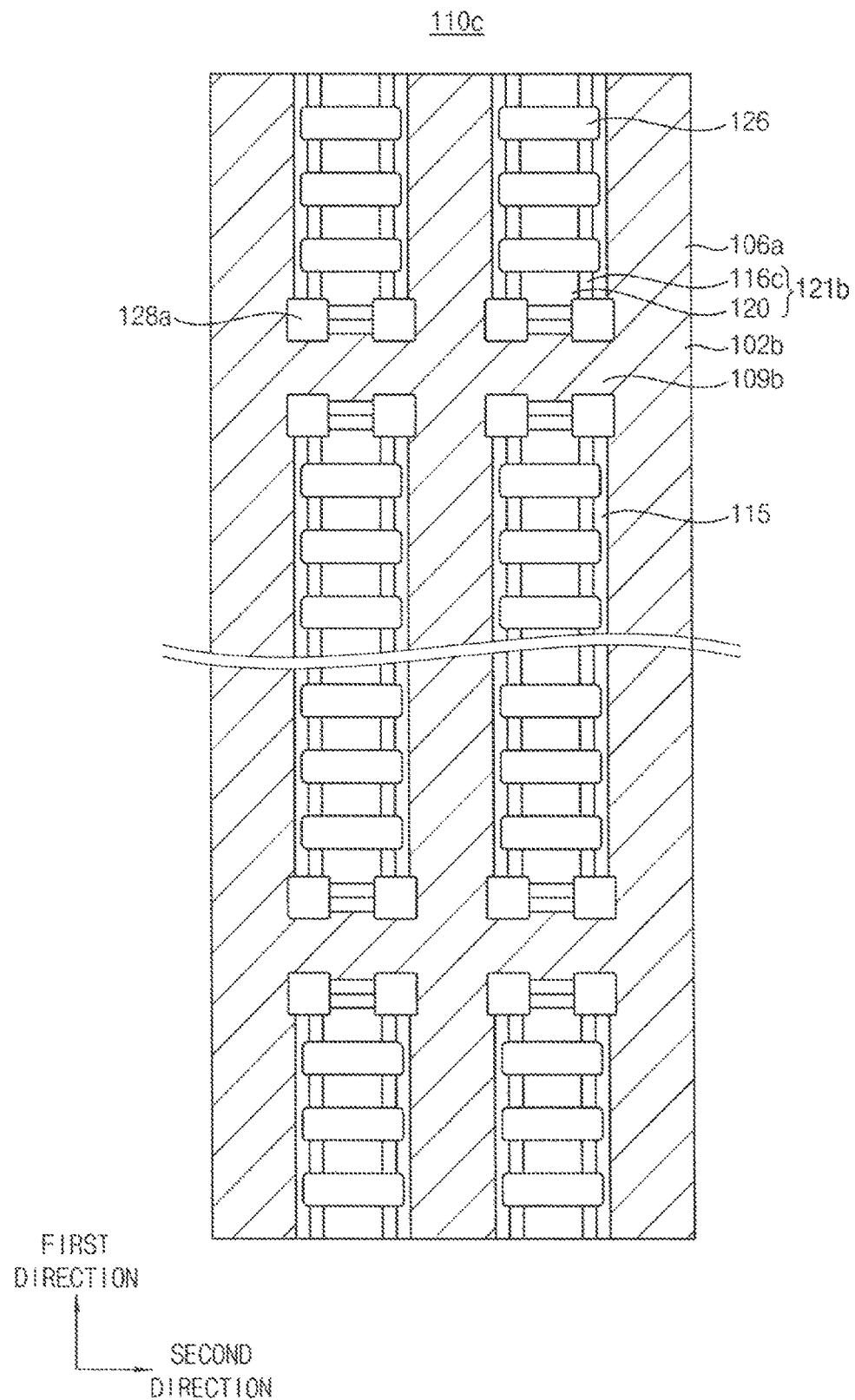
FIG. 23 is a plan view illustrating a vertical semiconductor device in accordance with an example embodiment of the present inventive concept.

FIG. 23 is a plan view illustrating a vertical semiconductor device in accordance with an example embodiment of the present inventive concept.

In the vertical semiconductor device, a cross-sectional view of a cell string may be substantially the same as one of FIG. 22. Each of the cell strings may extend in the vertical direction.

FIG. 23 is a plan view of a portion taken along line I-I' of FIG. 22.

Referring to FIG. 23, a conductive pattern structure 110c may include a first portion 106a extending in the first direction and a second portion 109b on a sidewall of the first portion 106a. The second portion 109b may connect two neighboring ones of the first portions 106a to each other.

Since all the first portions 106a are connected to each other through the second portions 109b, in the vertical semiconductor device, the conductive patterns 102b of the same level may be electrically connected to each other.

A pillar structure 121b may include two channel patterns 116c facing each other in the second direction and a first insulation pattern 120 interposed therebetween. A second insulation pattern 126 may be formed on a sidewall of the pillar structure 121b. In an example embodiment of the present inventive concept, the second insulation pattern 126 may fill a gap between the pillar structures 121b. A third insulation pattern 128a may be formed between some channel patterns 116c. The second insulation pattern 126 may be formed at an extending portion of the trench, and the third insulation pattern 128a may be formed at a bending portion of the trench. A longitudinal direction of the second insulation pattern 126 may be a direction perpendicular to an extending direction of the trench.

In the process of forming the third insulation pattern 128a, the memory layer 115 and the channel layer 116 formed on a bending portion, in which the first and second portions 106a and 109b of the conductive pattern structure 110c contact each other, may be cut by a second cutting hole. Thus, the memory layer 115 and the channel layer 116 may be divided to have a portion before the bending, portion and a portion after the bending potion by the second cutting hole. The second portion 109b of the conductive pattern structure 110c may not be divided by the second cutting holes. The third insulation pattern 128a may be formed in the second cutting hole.

In an example embodiment of the present inventive concept, the memory layer 115 and the channel pattern 116c on a sidewall of the second portion 109b may remain. Thus, the transistors consisting of the memory cells may be formed on the sidewall of the second portion 109b. The third insulation pattern 128a may be formed at a contact portion of the first and second portions 106a and 109b. For example, four third insulation patterns 128a may be formed on contact portions of two adjacent first portions 106a and one second portion 109b interposed therebetween.

Figure 24:
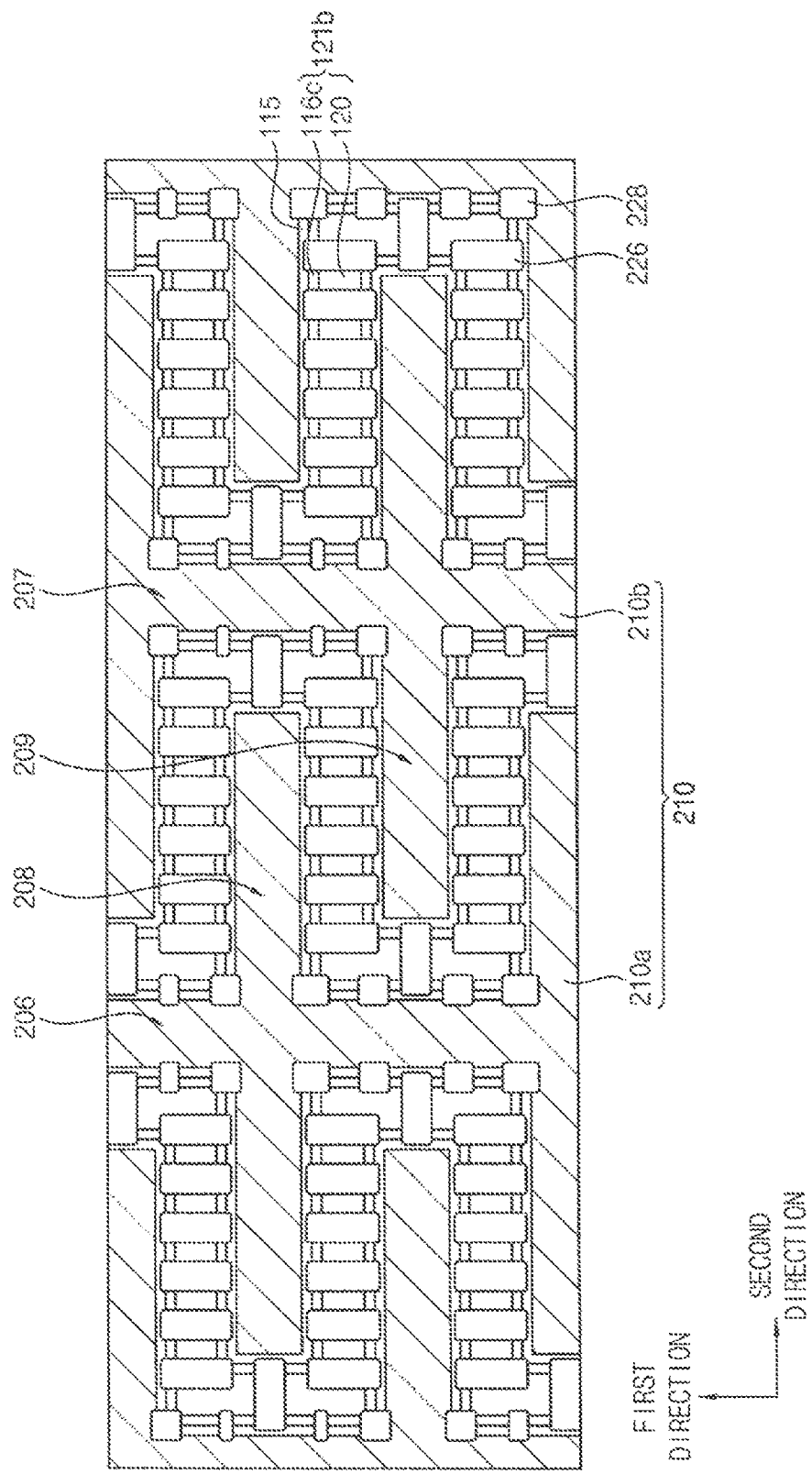
FIG. 24 is a plan view illustrating a vertical semiconductor device in accordance with an example embodiment of the present inventive concept.

FIG. 24 is a plan view illustrating a vertical semiconductor device in accordance with an example embodiment of the present inventive concept.

In the vertical semiconductor device, a cross-sectional view of a cell string may be substantially the same as a frontal view of FIG. 22. Each of the cell strings may extend in the vertical direction.

Referring to FIG. 24, conductive pattern structures 210 may include an odd conductive pattern structure 210a and an even conductive pattern structure 210b.

The odd conductive pattern structure 210a may include a first portion 206 extending in the first direction and a second portion 208 protruding from a sidewall of the first portion 206. A plurality of second portions 208 on the opposite sidewalls of the first portion 206 may be aligned in the second direction. That is, two second portions 208 aligned in the second direction may be formed on the opposite sides of the first portion 206. The second portions 208 may be formed on the opposite sidewalls of the first portion 206, and the second portions 208 may be spaced apart from each other in the first direction.

The even conductive pattern structure 210b may include a third portion 207 extending in the first direction and a fourth portion 209 protruding from a sidewall of the third portion 207. A plurality of fourth portions 209 on the opposite sidewalls of the third portion 207 may be aligned in the second direction. That is, two fourth portions 209 aligned in the second direction may be formed on the opposite sides of the third portion 207. The fourth portion 209 may be formed in a gap between the second portions 208 arranged in the first direction.

As a result of the structure described above, a trench having a connected S shape may be formed between the odd and even conductive pattern structures 210a and 210b. A plurality of trenches may be symmetric with respect to the first direction. That is, the trench may include a first portion extending in the first direction and a second portion extending in the second direction. A contact portion of the first and second portions may be bent.

The memory layer 115 may be formed on the odd and even conductive pattern structures 210a and 210b at the sidewall of the trench. The channel patterns 116c may be formed on the memory layer 115, and the channel patterns 116c may be spaced apart from each other. The channel patterns 116c may vertically extend from an upper sidewall of the conductive pattern structure 210 to the surface of the substrate 100. A first insulation pattern 120 may be formed between the channel patterns 116c in the trench. Two channel patterns 116c facing each other and the first insulation pattern 120 may form a pillar structure 121b.

A second insulation pattern 226 may be formed on a sidewall of the pillar structure 121b. The second insulation pattern 226 may be positioned at an extending portion of the trench. The two channel patterns 116c facing each other may be divided by the second insulation pattern 226. For example, in the second portion of the trench, the two channel patterns 116c facing each other in the second direction may be divided by the second insulation pattern 226. A third insulation pattern 228 may be formed between some channel patterns 116c. The third insulation patterns 228 may be positioned at a bent portion of the trench and a portion adjacent to the bent portion. The channel patterns 116c may be divided by the third insulation pattern 228.

The channel patterns 116c may be spaced apart from each other by the second and third insulation patterns 226 and 228.

A longitudinal direction of the second insulation pattern 226 may be a direction perpendicular to an extending direction of the trench. Thus, the longitudinal direction of some second insulation patterns 226 may be the first direction, and the longitudinal direction of other second insulation patterns 226 may be the second direction.

The third insulation pattern 228 may have a shape different from a shape of the second insulation pattern 226. In an example embodiment of the present inventive concept, the third insulation pattern 228 may have a width smaller than a width of the second insulation pattern 226.

In an example embodiment of the present inventive concept, some or all of the channel patterns 116c in the trench may have substantially the same width. All or some of distances between the channel patterns 116c in the trench may be substantially the same.

Figure 25:
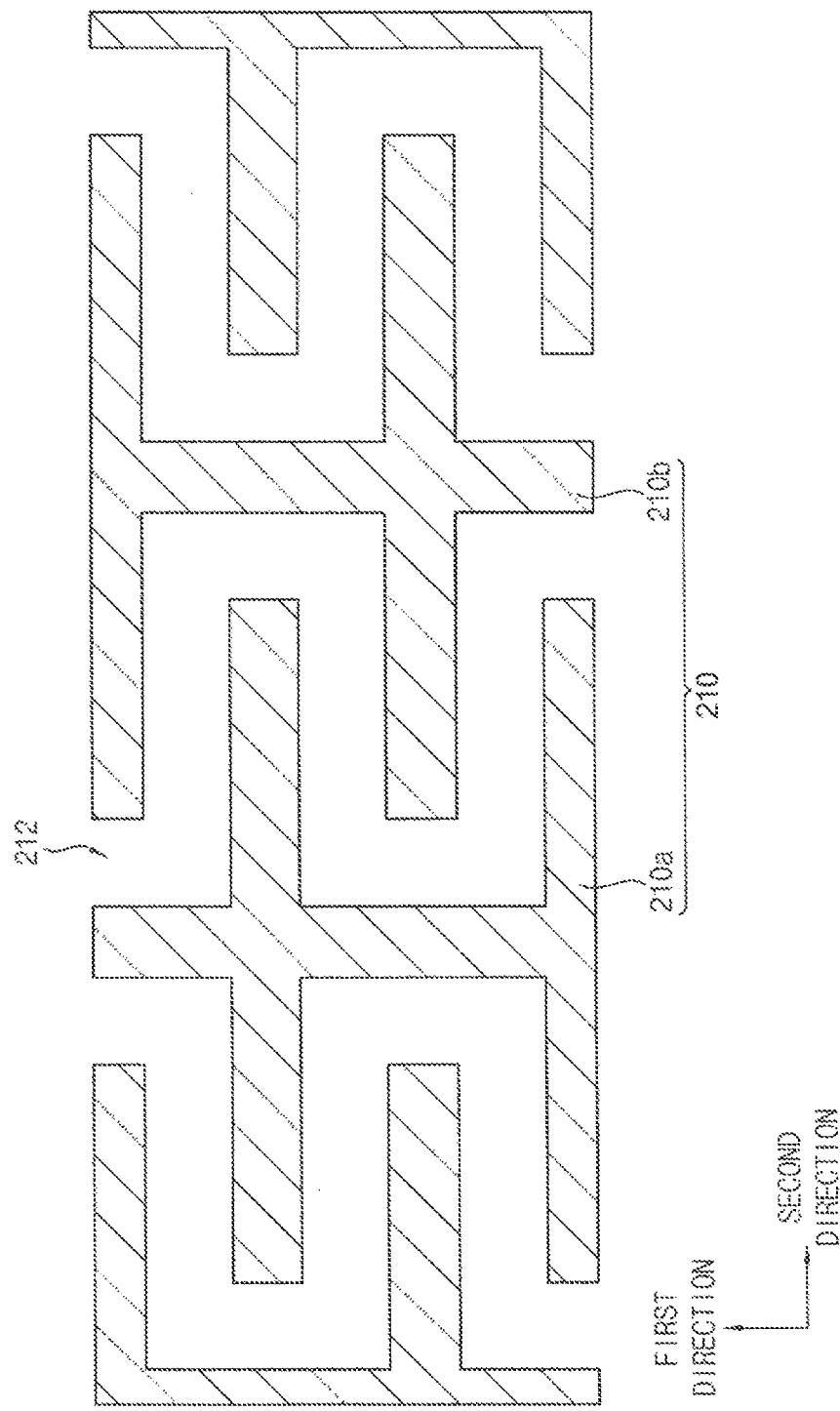
FIGS. 25 and 26 are plan views illustrating stages of a method of manufacturing a vertical semiconductor device in accordance with an example embodiment of the present inventive concept.
Figure 26:
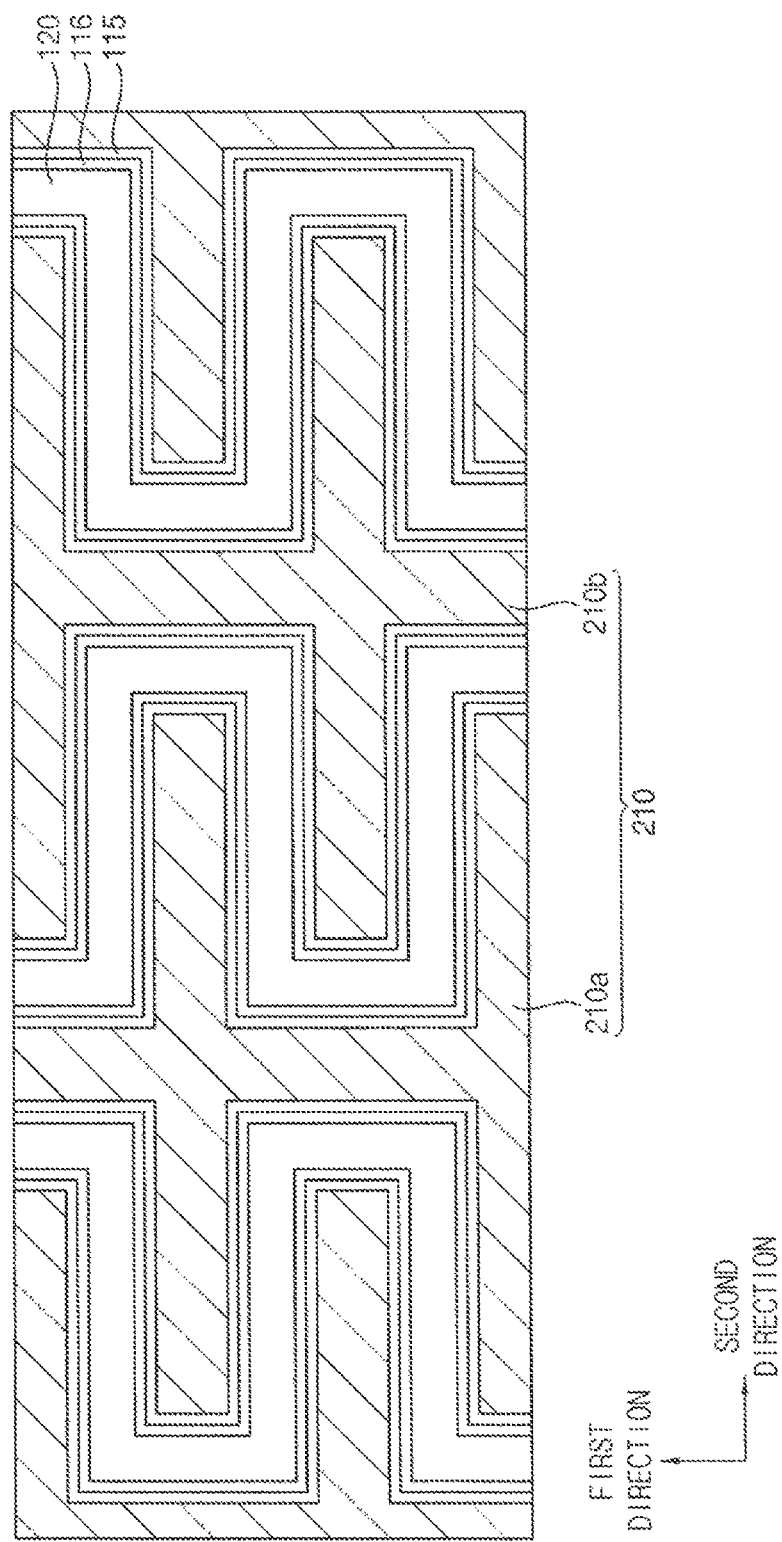

FIGS. 25 and 26 are plan views illustrating stages of a method of manufacturing a vertical semiconductor device in accordance with an example embodiment of the present inventive concept.

Referring to FIG. 25, first, processes substantially the same as or similar to those illustrated with reference to FIG. 8 may be performed to form the lower insulation layer 101 on the substrate 100, and the conductive layers 102 and the insulation layers 104 alternately and repeatedly stacked on the lower insulation layer 101. Then, the conductive layers 102, the insulation layers 104 and the lower insulation layer 101 may be etched to form conductive pattern structures 210. The substrate 100 may be exposed by a trench 212 between the conductive pattern structures 210.

Each of the conductive pattern structures 210 may have a shape substantially the same as or similar to that illustrated with reference to FIG. 24.

Referring to FIG. 26, the memory layer 115, the channel layer 116 and a first insulation pattern 120 may be formed to fill the trench 212 between the conductive pattern structures 210.

The memory layer 115 may be formed on a sidewall of the conductive pattern structure 210. The memory layer 115 may contact the substrate 100 exposed by the trench 212. Also, the channel layer 116 may be formed on the memory layer 115 and an upper surface of the conductive pattern structure 210. The channel layer 116 may contact the substrate 100 exposed by the trench 212.

Referring to FIG. 24 again, an etching mask may be firmed on the channel layer 116 and the first insulation pattern 120. The channel layer 116 and the first insulation pattern 120 may be etched to form first cutting holes and second cutting holes.

The first cutting holes may be a region for forming the second insulation patterns 226, and the second cutting holes may be a region for forming the third insulation patterns 228. The channel layer 116 may be cut by the first and second cutting holes to form preliminary channel patterns.

The second insulation pattern 226 may be formed in the first cutting holes, and the third insulation pattern 228 may be formed in the second cutting holes. Also, the preliminary channel patterns on the upper surface of the conductive pattern structure 210 may be etched to form channel patterns 116c. The channel patterns 116c on the upper surface of the conductive pattern structure 210 may be spaced apart from each other in the first and second directions.

Figure 27:
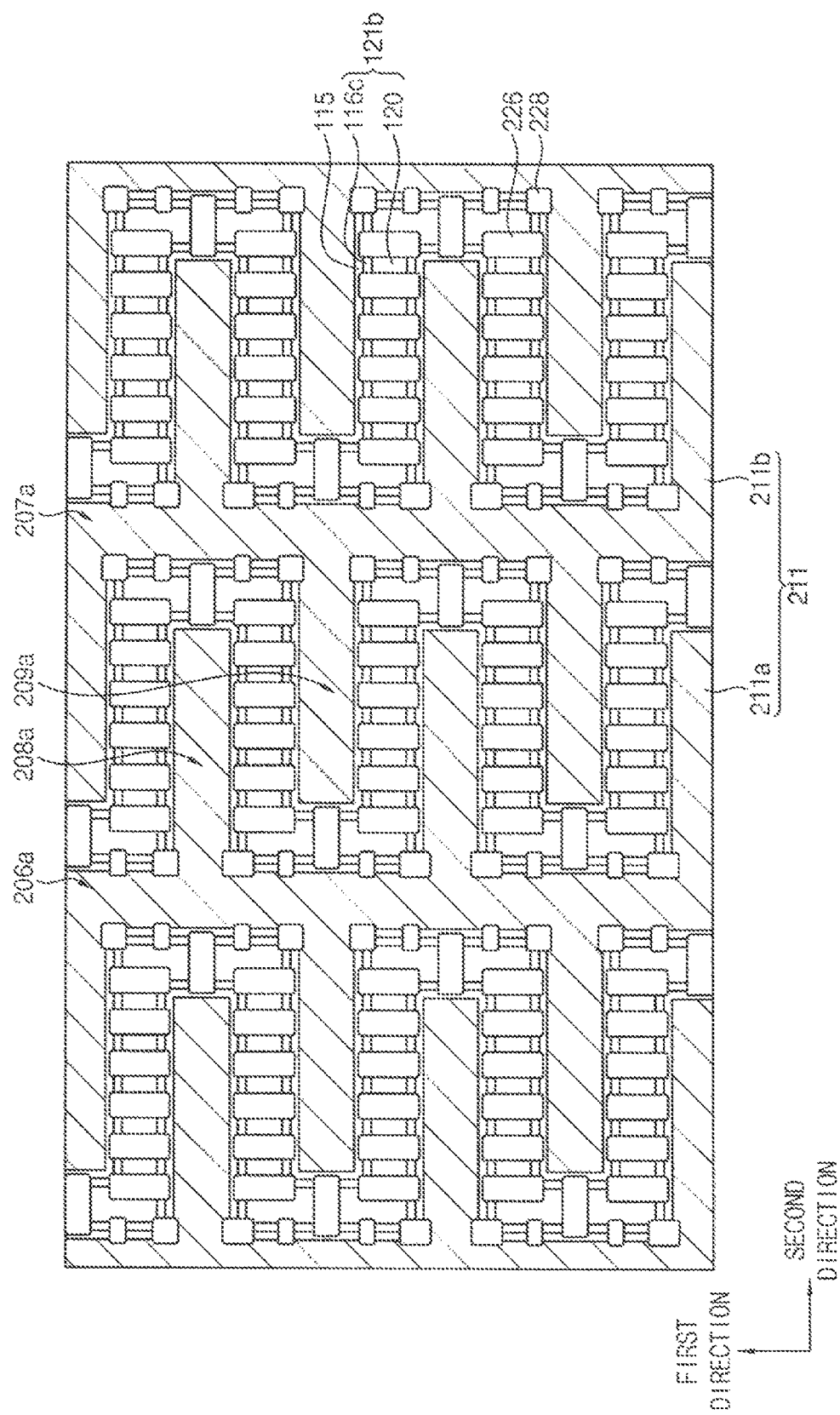
FIG. 27 is a plan view illustrating a vertical semiconductor device in accordance with an example embodiment of the present inventive concept.

FIG. 27 is a plan view illustrating a vertical semiconductor device in accordance with an example embodiment of the present inventive concept.

In the vertical semiconductor device, a cross-sectional view of cell string may be substantially the same as a frontal view of FIG. 22. Each of the cell strings may extend in the vertical direction.

The vertical semiconductor device of FIG. 27 may be substantially the same as or similar to that illustrated in FIG. 24, except for shapes of the conductive pattern structure 211 and second and third insulation patterns 226 and 228.

Referring to FIG. 27, the conductive pattern structures 211 may include an odd conductive pattern structure 211a and an even conductive pattern structure 211b.

The odd conductive pattern structure 211a may include a first portion 206a extending in the first direction and a second portion 208a protruding from a sidewall of the first portion 206a. A plurality of second portions 208a on the sidewall of the first portion 206a may not be aligned in the second direction. The second portions 208a may be formed on the opposite sidewalls of the first portion 206a, and the second portions 108a may be spaced apart from each other in the first direction.

The even conductive pattern structure 211b may include a third portion 207a extending in the first direction and a fourth portion 209a protruding from a sidewall of the third portion 207a. A plurality of fourth portions 209a may not be aligned in the second direction. The fourth portion 209a may be formed in a gap between the second portions 208a arranged in the first direction. The second portion 208a of the odd conductive pattern structure 211a may be aligned with the fourth portion 209a of the even conductive pattern structure 211b in the second direction.

A trench having a connected S shape may be formed between the odd and even conductive pattern structures 211a and 211b. That is, the trench may include a first portion extending in the first direction and a second portion extending in the second direction. A contact portion of the first and second portions may be bent.

The memory layer 115, the channel pattern 116c and the first insulation pattern 120 may be formed on the conductive pattern structure 211. A pillar structure 121b including the channel pattern 116c and the first insulation pattern 120 may be formed in the trench. A second insulation pattern 226 may be formed on a sidewall of the pillar structure 121b. A third insulation pattern 228 may be formed between some channel patterns 116c. The second insulation pattern 226 may be positioned at an extending portion of the trench. The third insulation patterns 228 may be positioned at a bent portion of the trench and a portion adjacent to the bent portion. A longitudinal direction of the second insulation pattern 226 may be a direction perpendicular to an extending direction of the trench. The channel patterns 116c may be spaced apart from each other by the second and third insulation patterns 226 and 228. In the second portion of the trench, the two channel patterns 116c facing each other in the second direction may be divided by the second insulation pattern 226. In an example embodiment of the present inventive concept, all or sonic of the channel patterns 116c in the trench may have substantially the same width. All or some of distances between the channel patterns 116c in the trench may be substantially the same.

The vertical semiconductor device may be manufactured by processes substantially the same as or similar to those illustrated with reference to FIGS. 25 and 26. However, the conductive pattern structure 211 may be formed to have a shape illustrated with reference to FIG. 27. Also, the first and second cutting holes may be formed so as to form the second and third insulation patterns 226 and 228.

Figure 28:
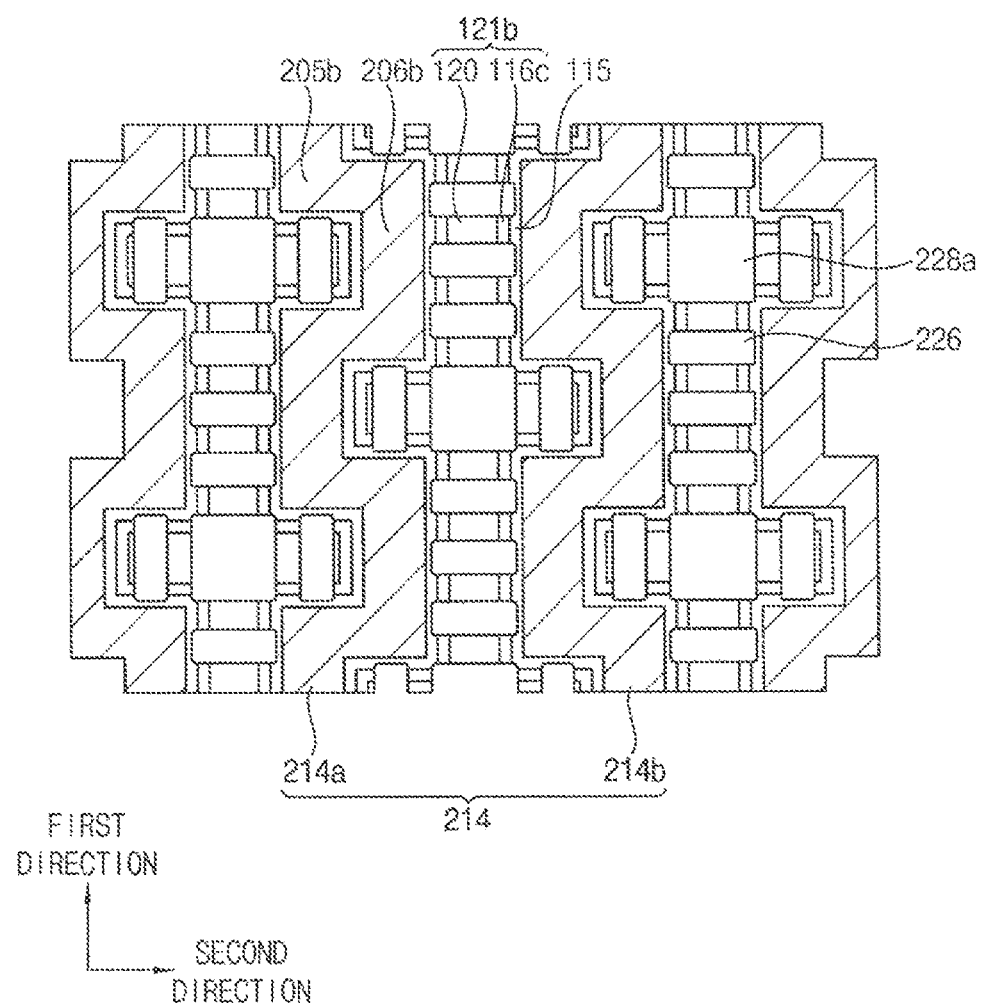
FIG. 28 is a plan view illustrating a vertical semiconductor device in accordance with an example embodiment of the present inventive concept.

FIG. 28 is a plan view illustrating a vertical semiconductor device in accordance with an example embodiment of the present inventive concept.

In the vertical semiconductor device, a cross-sectional view of a cell string may be substantially the same as a frontal view of FIG. 22.

The vertical semiconductor device of FIG. 28 may be substantially the same as or similar to that illustrated in FIG. 24, except for shapes of the conductive pattern structure 214 and second and third insulation patterns 226 and 228a.

Referring to FIG. 28, the conductive pattern structures 214 may include an odd conductive pattern structure 214a and an even conductive pattern structure 214b.

The odd conductive pattern structure 214a may include first portions 206b extending in the first direction and second portions 205b extending in the second direction. The first and second portions 206b and 205b may be alternatively and repeatedly arranged in the first direction. Thus, the odd conductive pattern structure 214a may have a connected S shape.

The even conductive pattern structure 214b may have a connected S shape substantially the same as or similar to the shape of the odd conductive pattern structure 214a. The odd and even conductive pattern structures 214a and 214b may be symmetric with respect to the first direction.

A trench may be formed between the odd and even conductive pattern structures 214a and 214b. The trench may include a first portion extending in the first direction and a second portion protruding from a sidewall of the first portion. A plurality of second portions on the opposite sidewalk of the first portion may be aligned in the second direction. That is, two second portions of the trench aligned in the second direction may be disposed on the opposite sides of the first portion of the trench. The second portions in neighboring trenches may not be aligned in the second direction.

The memory layer 115 and a pillar structure 121b including the channel pattern 116c and the first insulation pattern 120 may be formed on the conductive pattern structure 214. A second insulation pattern 226 or a third insulation pattern 228a may be formed on a sidewall of the pillar structure 121b. In an example embodiment of the present inventive concept, the second insulation pattern 226 may be positioned at an extending portion of the trench. The third insulation pattern 228a may be adjacent to a contact portion of the first and second portions of the trench. A longitudinal direction of the second insulation pattern 226 may be a direction perpendicular to an extending direction of the trench. The channel patterns 116c may be spaced apart from each other by the second and third insulation patterns 226 and 228a. In an example embodiment of the present inventive concept, all or some of the channel patterns 116c in the trench may have substantially the same width. All or some of distances between the channel patterns 116c in the trench may be substantially the same.

Figure 29:
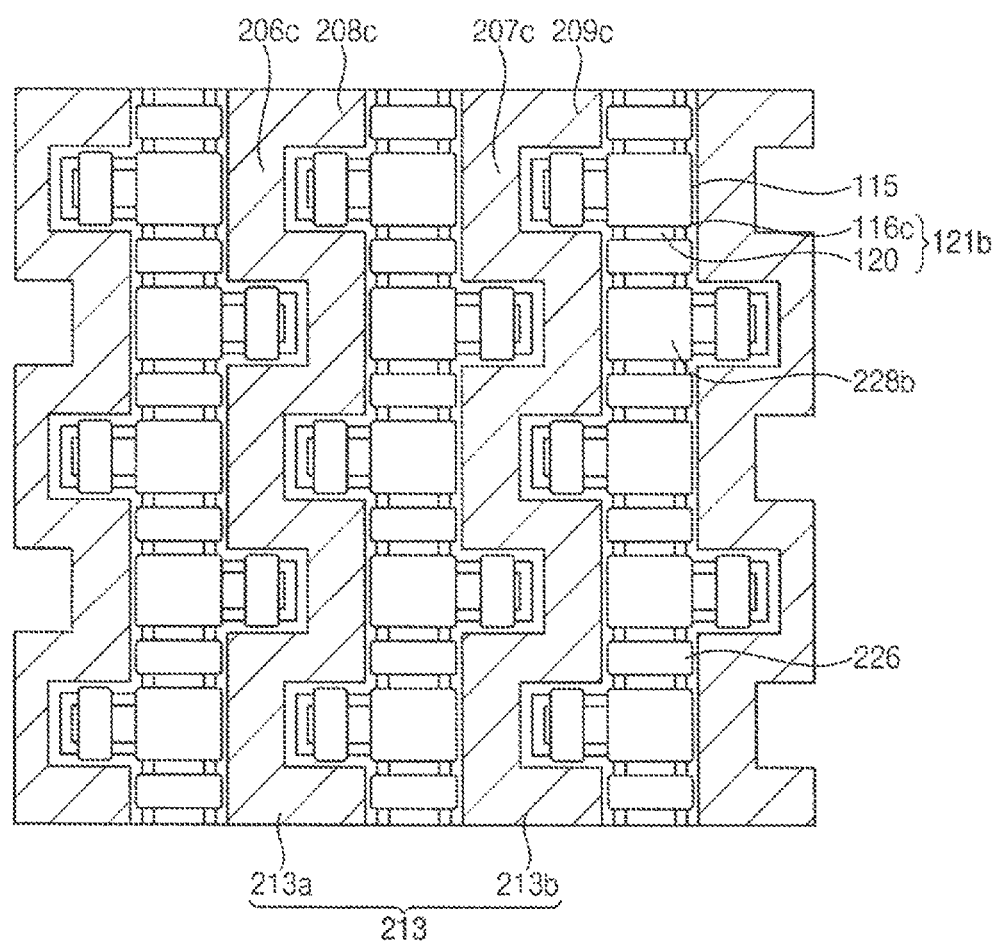
FIG. 29 is a plan view illustrating a vertical semiconductor device in accordance with an example embodiment of the present inventive concept.

FIG. 29 is a plan view illustrating a vertical semiconductor device in accordance with an example embodiment of the present inventive concept.

In the vertical semiconductor device, a cross-sectional view of a cell string may be substantially the same as a frontal view of FIG. 22.

The vertical semiconductor device of FIG. 29 may be substantially the same as or similar to that illustrated in FIG. 24, except for shapes of the conductive pattern structure 213 and second and third insulation patterns 226 and 228b.

Referring to FIG. 29, the conductive pattern structures 213 may include an odd conductive pattern structure 213a and an even conductive pattern structure 213b.

The odd conductive pattern structure 213a may include first portions 206c extending in the first direction and second portions 208c extending in the second direction. The first and second portions 206c and 208c may be repeatedly arranged in the first direction. Thus, the odd conductive pattern structure 213a may have a connected S shape.

The even conductive pattern structure 213b may have a connected S shape substantially the same as the shape of the odd conductive pattern structure 213a. The even conductive pattern structure 213b may include third portions 207c extending in the first direction and fourth portions 209c extending in the second direction. The third and fourth portions 207c and 209c may be repeatedly arranged in the first direction. The odd and even conductive pattern structures 213a and 213b may be arranged in the second direction.

A trench may be formed between the odd and even conductive pattern structures 213a and 213b. The trench may include a first portion extending in the first direction and a second portion protruding from a sidewall of the first portion. A plurality of second portions on the opposite sidewalls of the first portion may not be aligned in the second direction. The second portions in neighboring trenches may be aligned in the second direction.

The memory layer 115, the channel pattern 116c and the first insulation pattern 120 may be formed on the conductive pattern structure 213. A second insulation pattern 226 or a third insulation pattern 228b may be formed on a sidewall of a pillar structure 121b including the channel pattern 116c and the first insulation pattern 120. In an example embodiment of the present inventive concept, the second insulation pattern 226 may be positioned at an extending portion of the trench. The third insulation pattern 228b may be adjacent to a contact portion of the first and second portions of the trench. A longitudinal direction of the second insulation pattern 226 may be a direction perpendicular to an extending direction of the trench.

The channel patterns 116c may be spaced apart from each other by the second and third insulation patterns 226 and 228b. In an example embodiment of the present inventive concept, all or some of the channel patterns 116c in the trench may have substantially the same width. All or some of distances between the channel patterns 116c in the trench may be substantially the same.

While specific example embodiments have been particularly shown and described above, it will be understood by one of ordinary skill in the art that variations in forgo and detail may be made therein without departing from the spirit and scope of the present inventive concept as defined by the appended claims.

What is claimed is:

1. A vertical semiconductor device, comprising:
a conductive pattern structure including conductive patterns and insulation layers alternately and repeatedly stacked on a substrate, the conductive pattern structure including a first portion extending in a first direction and a second portion protruding from a sidewall of the first portion, wherein the conductive pattern structure is provided in plural and the plurality of conductive pattern structures are arranged in a second direction perpendicular to the first direction to form a trench therebetween;
a memory layer formed on sidewalls of the plurality of conductive pattern structures, the memory layer including a blocking dielectric layer, a charge storage layer and a tunnel insulation layer;
a pillar structure formed on the memory layer, the pillar structure including a channel pattern and a first insulation pattern, wherein the pillar structure is provided in plural and the plurality of pillar structures in the trench are spaced apart from each other in the first direction;
a second insulation pattern formed between the plurality of pillar structures; and
a third insulation pattern formed between some of the plurality of pillar structures, the third insulation pattern having a shape different from a shape of the second insulation pattern.

2. The vertical semiconductor device of claim 1, wherein the trench is formed between the first portions and the second portions of the plurality of conductive pattern structures, and the trench extends in the first direction.

3. The vertical semiconductor device of claim 1, wherein
the second insulation pattern is formed in the trench between the first portions, with a sidewall contacting one layer of the memory layer, and
the third insulation pattern is formed in the trench, and contacts the second portion.

4. The vertical semiconductor device of claim 1, wherein
a width in the second direction of the third insulation pattern is substantially the same as a width in the second direction of the second insulation pattern, and
a width in the first direction of the third insulation pattern is greater than a width in the first direction of the second insulation pattern.

5. The vertical semiconductor device of claim 1, wherein
a width in the second direction of the third insulation pattern is smaller than a width in the second direction of the second insulation pattern, and
a width in the first direction of the third insulation pattern is greater than a width in the first direction of the second insulation pattern.

6. The vertical semiconductor device of claim 1, wherein the second portions of two neighboring ones of the plurality of conductive pattern structures are arranged to be aligned in the second direction.

7. The vertical semiconductor device of claim 1, wherein the second portions on opposite sidewalls of the first portion are arranged to be aligned in the second direction.

8. The vertical semiconductor device of claim 1, wherein the second portions on opposite sidewalls of the first portion are arranged not to be aligned in the second direction.

9. The vertical semiconductor device of claim 1, wherein the channel patterns are spaced apart from each other by the second insulation pattern or the third insulation pattern.

10. The vertical semiconductor device of claim 1, wherein the plurality of conductive pattern structures include an odd conductive pattern structure and an even conductive pattern structure, the channel pattern is formed on a sidewall of the odd conductive pattern structure, a bottom of the trench and a sidewall of the even conductive pattern structure, and a cross-section of the channel pattern in a vertical direction perpendicular to the first and second directions has a "U" shape.

11. The vertical semiconductor device of claim 1, wherein the channel pattern vertically extends from an upper sidewall of the conductive pattern structure to a bottom of the trench.

12. The vertical semiconductor device of claim 1, wherein the first and second portions of the conductive pattern structure are alternately and repeatedly arranged in the first direction so that the conductive pattern structure has a connected S shape.

13. The vertical semiconductor device of claim 1, wherein the trench formed between the plurality of conductive pattern structures has a connected S shape.

14. A vertical semiconductor device, comprising:
a conductive pattern structure including conductive patterns and insulation layers alternately and repeatedly stacked on a substrate, the conductive pattern structure including a first portion extending in a first direction and a second portion protruding in a second direction perpendicular to the first direction from a sidewall of the first portion, wherein the conductive pattern structure is provided in plural and a trench is formed between the first portions and the second portions;
a memory layer formed on a sidewall of the conductive pattern structure;
a pillar structure including a channel pattern and a first insulation pattern formed on the memory layer, the pillar structure being provided in plural and the plurality of pillar structures being spaced apart from each other in the first direction;
a second insulation pattern formed in the trench between the first portions, the second. insulation pattern being between the plurality of pillar structures; and
a third insulation pattern formed in the trench, the third insulation pattern contacting the second portion.

15. The vertical semiconductor device of claim 14, wherein a sidewall of the second insulation pattern contacts one layer included in the memory layer which includes one or more layers.

16. The vertical semiconductor device of claim 14, the third insulation pattern has a shape different from a shape of the second insulation pattern.

17. The vertical semiconductor device of claim 14, wherein
the plurality of conductive pattern structures include an odd conductive pattern structure and an even conductive pattern structure,
the channel pattern is formed on a sidewall of the odd conductive pattern structure, a bottom of the trench and a sidewall of the even conductive pattern structure, and
a cross-section of the channel pattern in a vertical direction perpendicular to the first and. second directions has a "U" shape.

18. The vertical semiconductor device of claim 14, wherein the channel pattern vertically extends from an upper sidewall of the conductive pattern structure to a bottom of the trench.

19. A vertical semiconductor device, comprising:
a plurality of conductive pattern structures, each of the plurality of conductive pattern structures including conductive patterns and insulation layers alternately and repeatedly stacked on a substrate, each of the plurality of conductive pattern structures including a first portion extending in a first direction and a second portion protruding from a sidewall of the first portion;
a memory layer formed on a sidewall of the plurality of conductive pattern structures, the memory layer including a blocking dielectric layer, a charge storage layer and a tunnel insulation layer;
a pillar structure including a channel pattern and a first insulation pattern formed on the memory layer, the pillar structure being provided in plural and the plurality of pillar structures being spaced apart from each other in the first direction;
a second insulation pattern formed in a trench between the plurality of conductive pattern structures, the second insulating pattern being between the plurality of pillar structures, wherein a longitudinal direction of the second insulation pattern is a direction perpendicular to an extending direction of the trench; and
a third insulation pattern formed between some of the plurality of pillar structures, the third insulation pattern having a shape different from a shape of the second insulation pattern.

20. The vertical semiconductor device of claim 19, wherein the third insulation pattern is formed in the trench, and contacts the second portion.

* * * * *